(12) United States Patent
Chung et al.

(10) Patent No.: US 11,430,772 B2
(45) Date of Patent: Aug. 30, 2022

(54) SEMICONDUCTOR PACKAGE

(71) Applicant: SAMSUNG ELECTRONICS CO., LTD., Suwon-si (KR)

(72) Inventors: Hyunsoo Chung, Hwaseong-si (KR); Taewon Yoo, Seoul (KR); Myungkee Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/205,659

(22) Filed: Mar. 18, 2021

(65) Prior Publication Data
US 2022/0037295 A1    Feb. 3, 2022

(30) Foreign Application Priority Data
Jul. 30, 2020    (KR) .................. 10-2020-0095416

(51) Int. Cl.
*H01L 25/10*    (2006.01)
*H01L 23/31*    (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC ............. H01L 23/3128; H01L 23/5383; H01L 23/5386; H01L 23/5389; H01L 23/528; H01L 23/5884; H01L 23/544; H01L 23/49816; H01L 23/31; H01L 23/481; H01L 23/485; H01L 23/525; H01L 25/105; H01L 25/50; H01L 25/0657; H01L 21/4853; H01L 21/4857; H01L 21/565; H01L 21/6835; H01L 24/19; H01L 24/20; H01L 2224/214; H01L 2224/215;
(Continued)

(56) References Cited

U.S. PATENT DOCUMENTS 9,269,622 B2    2/2016  Scanlan et al.
9,633,939 B2    4/2017  Kim et al.
(Continued)

*Primary Examiner* — Kyoung Lee
*Assistant Examiner* — Christina A Sylvia
(74) *Attorney, Agent, or Firm* — F. Chau & Associates, LLC

(57) ABSTRACT

A semiconductor package includes a bottom package and an upper redistribution layer disposed on the bottom package. The bottom package includes a substrate and a semiconductor chip disposed on the substrate. A conductive pillar extends upwardly from the substrate and is spaced apart from the semiconductor chip. A mold layer is disposed on the substrate and encloses the semiconductor chip and lateral side surfaces of the conductive pillar. The conductive pillar includes a connection pillar configured to electrically connect the substrate to the upper redistribution layer and an alignment pillar that is spaced apart from the connection pillar. The upper redistribution layer includes a redistribution metal pattern configured to be electrically connected to the connection pillar. A first insulating layer is in direct contact with a top surface of the redistribution metal pattern. A top surface of the alignment pillar is in direct contact with the first insulating layer.

20 Claims, 24 Drawing Sheets

(51) Int. Cl.
*H01L 23/538* (2006.01)
*H01L 23/00* (2006.01)
*H01L 21/48* (2006.01)
*H01L 21/56* (2006.01)
*H01L 25/00* (2006.01)

(52) U.S. Cl.
CPC ........ *H01L 21/565* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/50* (2013.01); *H01L 2224/214* (2013.01); *H01L 2224/215* (2013.01); *H01L 2225/1035* (2013.01); *H01L 2225/1041* (2013.01); *H01L 2225/1058* (2013.01); *H01L 2225/1082* (2013.01)

(58) Field of Classification Search
CPC ..... H01L 2225/1035; H01L 2225/1041; H01L 2225/1058; H01L 2225/1082; H01L 2221/68345; H01L 2221/68359; H01L 2223/54426

See application file for complete search history.

(56) References Cited

U.S. PATENT DOCUMENTS

| | | |
|---|---|---|
| 9,825,005 B2 | 11/2017 | Yeh et al. |
| 2012/0103667 A1* | 5/2012 | Ito ................... H05K 3/108 174/257 |
| 2013/0037929 A1 | 2/2013 | Essig et al. |
| 2016/0218072 A1* | 7/2016 | Liao .................. H01L 23/66 |
| 2018/0308800 A1* | 10/2018 | Tsai ................. H01L 21/6835 |
| 2018/0330966 A1 | 11/2018 | Scanlan et al. |
| 2019/0103379 A1* | 4/2019 | Yu ..................... H01L 23/3128 |
| 2020/0006274 A1 | 1/2020 | Chiang et al. |
| 2020/0091086 A1 | 3/2020 | Huang et al. |
| 2020/0105544 A1 | 4/2020 | Tsai et al. |
| 2021/0391290 A1* | 12/2021 | Chang .................. H01L 24/05 |

* cited by examiner

SEMICONDUCTOR PACKAGE

CROSS-REFERENCE TO RELATED APPLICATIONS

This application claims priority under 35 U.S.C. § 119 to Korean Patent Application No. 10-2020-0095416, filed on Jul. 30, 2020 in the Korean Intellectual Property Office, the disclosure of which is incorporated by reference in its entirety herein.

1. TECHNICAL FIELD

The present inventive concepts relate to a semiconductor package and a method of fabricating the same, and in particular, to a semiconductor package, which is configured to accurately align a mask that is used to form a redistribution layer, and a method of fabricating the same.

2. DISCUSSION OF RELATED ART

A semiconductor package is configured to utilize a semiconductor chip as a part of an electronic product. In general, the semiconductor package includes a substrate, such as a printed circuit board (PCB), and a semiconductor chip mounted thereon. A plurality of semiconductor chips are mounted in each semiconductor package. The semiconductor chips are configured to have various functions. The semiconductor chips are stacked on a single substrate. Recently, a Package-On-Package (POP) structure, in which a semiconductor package is placed on another semiconductor package, has been used for various electronic products. To realize the POP structure, an underlying semiconductor package includes a redistribution layer (RDL).

SUMMARY

An embodiment of the present inventive concepts provides a semiconductor package, which allows a redistribution layer to be accurately formed, and a method of fabricating the same.

An embodiment of the present inventive concepts provides a semiconductor package, in which a redistribution metal pattern is stably connected to a conductive pillar, and a method of fabricating the same.

An embodiment of the present inventive concepts provides a method of easily fabricating a semiconductor package and a semiconductor package fabricated thereby.

An embodiment of the present inventive concepts provides a method of fabricating a semiconductor package in high yield and a semiconductor package fabricated thereby.

According to an embodiment of the present inventive concepts, a semiconductor package includes a bottom package and an upper redistribution layer disposed on the bottom package. The bottom package includes a substrate and a semiconductor chip disposed on the substrate. A conductive pillar extends upwardly from the substrate and is spaced apart from the semiconductor chip. A mold layer is disposed on the substrate and encloses the semiconductor chip and lateral side surfaces of the conductive pillar. The conductive pillar includes a connection pillar configured to electrically connect the substrate to the upper redistribution layer and an alignment pillar that is spaced apart from the connection pillar. The upper redistribution layer includes a redistribution metal pattern configured to be electrically connected to the connection pillar. A first insulating layer is in direct contact with a top surface of the redistribution metal pattern. A top surface of the alignment pillar is in direct contact with the first insulating layer.

According to an embodiment of the present inventive concepts, a semiconductor package includes a bottom package. An upper redistribution layer is disposed on the bottom package. An upper package is disposed on the upper redistribution layer. The bottom package includes a substrate. A semiconductor chip is disposed on the substrate. A conductive pillar extends upwardly from the substrate. The conductive pillar is spaced apart from the semiconductor chip. A mold layer is disposed on the substrate and encloses lateral side surfaces of the semiconductor chip and lateral side surfaces of the conductive pillar. The conductive pillar includes a connection pillar configured to electrically connect the substrate to the upper redistribution layer. An alignment pillar is spaced apart from the connection pillar. The upper redistribution layer includes an interfacial layer disposed on the mold layer. A redistribution metal pattern is configured to be electrically connected to the connection pillar. A first insulating layer is disposed on the interfacial layer and the redistribution metal pattern. The alignment pillar is configured to be electrically disconnected from the redistribution metal pattern.

According to an embodiment of the present inventive concepts, a semiconductor package includes a substrate. A semiconductor chip is disposed on the substrate. A plurality of conductive pillars is disposed on the substrate and is spaced apart from the semiconductor chip. A mold layer is disposed on the substrate and encloses the semiconductor chip and lateral side surfaces of each of the plurality of conductive pillars. An upper redistribution layer is disposed on the mold layer. Each of the plurality of conductive pillars includes a first metal portion that extends upwardly from the substrate and a second metal portion disposed on the first metal portion. The first metal portion and the second metal portion comprise different materials from each other. A level of a top surface of the second metal portion is lower than a level of a top surface of the mold layer.

According to an embodiment of the present inventive concepts, a semiconductor package includes a bottom package that includes a substrate. A semiconductor chip is disposed on the substrate. A conductive pillar extends upwardly from the substrate. The conductive pillar is spaced apart from the semiconductor chip. A mold layer is disposed on the substrate. The conductive pillar includes a connection pillar configured to electrically connect the substrate to an upper an redistribution layer. An alignment pillar is spaced apart from the connection pillar. A preliminary seed-barrier layer is disposed directly on an upper surface of the alignment pillar. The alignment pillar is configured to provide an alignment mark for aligning a photomask for forming the upper redistribution layer on the bottom package.

BRIEF DESCRIPTION OF THE DRAWINGS

Embodiments of the present inventive concepts will be more clearly understood from the following brief description taken in conjunction with the accompanying drawings. The accompanying drawings represent non-limiting, embodiments as described herein.

DETAILED DESCRIPTION OF EMBODIMENTS

Embodiments of the present inventive concepts will now be described more fully with reference to the accompanying drawings, in which example, non-limiting embodiments are shown.

Figure 1:
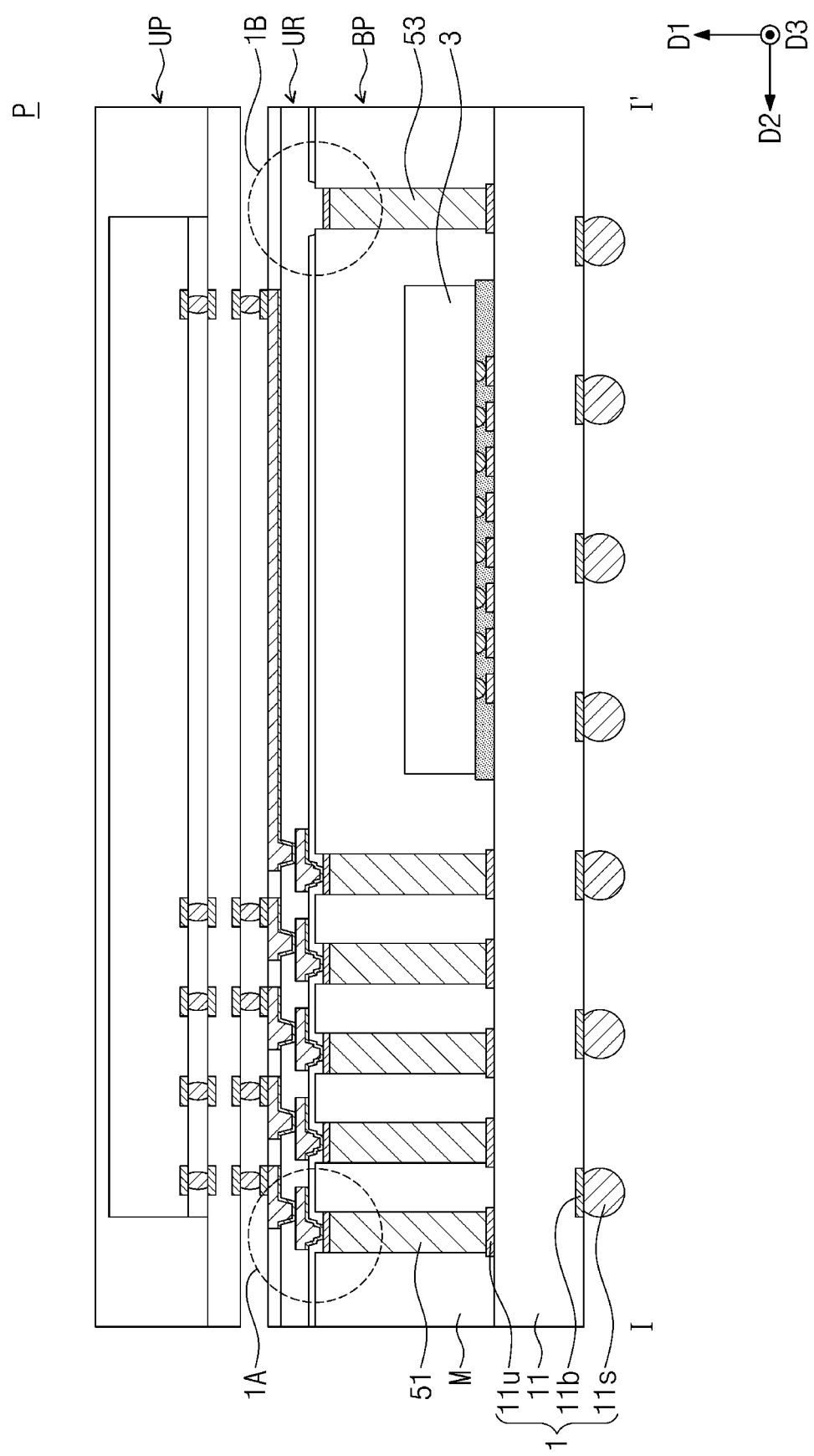
FIG. 1 is a cross-sectional view illustrating a semiconductor package taken along line I-I' of FIG. 2 according to an embodiment of the present inventive concepts.
Figure 2:
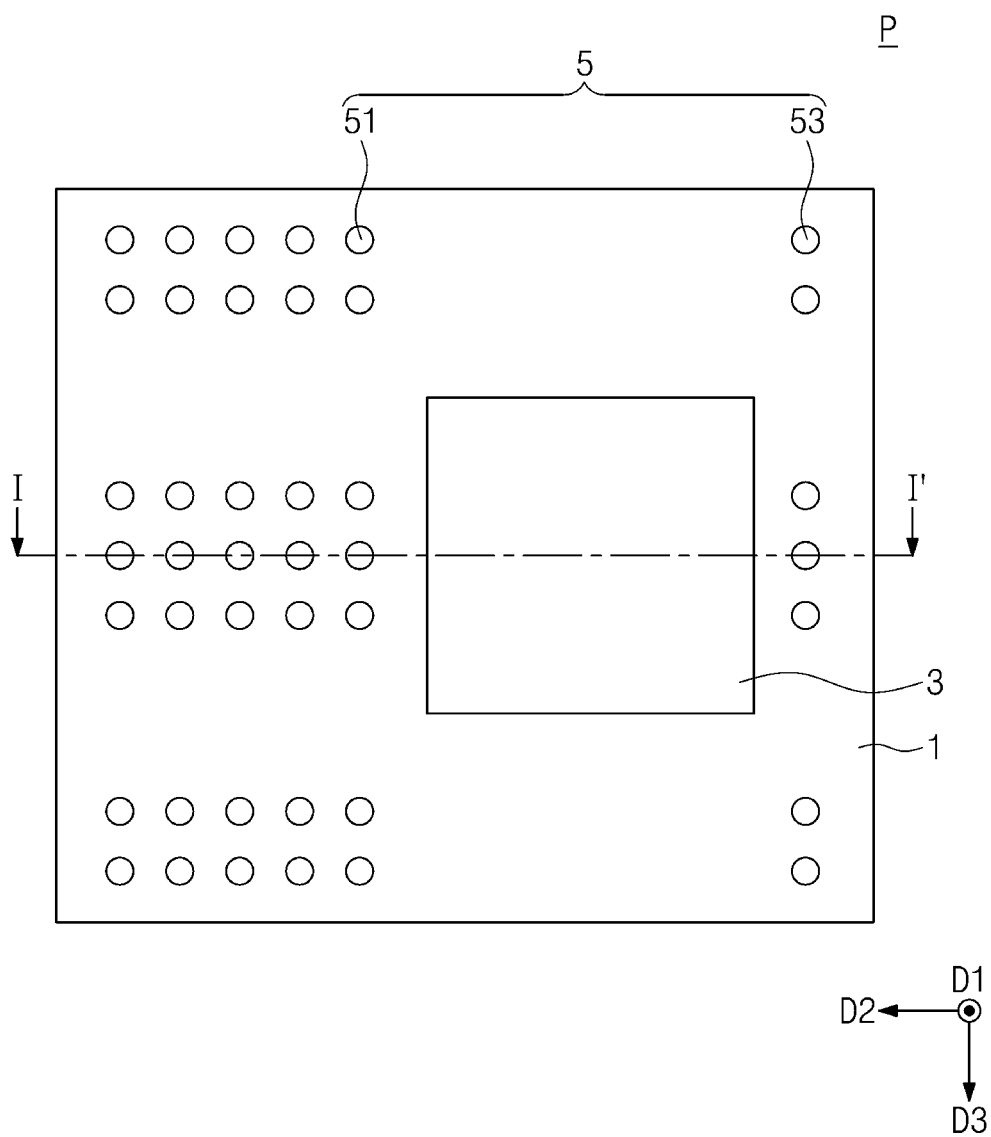
FIG. 2 is a plan view illustrating a semiconductor package according to an embodiment of the present inventive concepts.

FIG. 1 is a cross-sectional view illustrating a semiconductor package according to an embodiment of the present inventive concepts, and FIG. 2 is a plan view illustrating a semiconductor package according to an embodiment of the present inventive concepts. In detail, FIG. 1 is a cross-sectional view taken along a line I-I' of FIG. 2. FIG. 2 is a plan view, which illustrates the semiconductor package shown in FIG. 1, but from which an upper package UP, an upper redistribution layer UR, and a mold layer M are omitted for convenience of illustration.

Hereinafter, in FIG. 1, the reference characters "D1" and "D2" will be referred to as first and second directions, respectively, and the reference character "D3", which is depicted to be perpendicular to the first and second directions D1 and D2, will be referred to as a third direction. The third direction may be a thickness direction of the semiconductor package P and the first and second directions D1, D2 may be horizontal directions of the semiconductor package P.

Referring to FIGS. 1 and 2, a semiconductor package P may be provided. The semiconductor package P may include a bottom package BP, an upper redistribution layer UR disposed on the bottom package BP, and an upper package UP disposed on the upper redistribution layer UR.

The bottom package BP may include a substrate 1, a semiconductor chip 3, a mold layer M, and a conductive pillar 5 (e.g., see FIG. 2).

In an embodiment, the substrate 1 may include a printed circuit board (PCB) and/or a redistribution substrate. In the following description, a PCB substrate will be referred to as an example of the substrate 1. However, embodiments of the present inventive concepts are not limited thereto. The substrate 1 may include a substrate body 11, an upper pad 11u, a bottom pad 11b, and an outer connection ball 11s. In an embodiment, the substrate body 11 may include an insulating material. An interconnection line may be disposed in the substrate body 11. The interconnection line may electrically connect the upper pad 11u to the bottom pad 11b. In an embodiment, the interconnection line may not be electrically connected to an alignment pillar 53. For example, the interconnection line in the substrate 1 may not be electrically connected to a pad placed below the alignment pillar 53. The upper pad 11u may be exposed to the outside of the substrate body 11, near a top surface of the substrate body 11. As shown in the embodiment of FIG. 1, a plurality of upper pads 11u may be disposed on an upper surface of the substrate body 11. The upper pads 11u may be spaced apart from each other in the second direction D2 and the third direction D3. For convenience of explanation, just one of the upper pads 11u will be described in the following description. The upper pad 11u may be electrically connected to the semiconductor chip 3 and/or the conductive pillar 5. The bottom pad 11b may be exposed to the outside of the substrate body 11, near a bottom surface of the substrate body 11. In an embodiment, a plurality of bottom pads 11b may be disposed on a lower surface of the substrate body 11. The bottom pads 11b may be spaced apart from each other in the second direction D2 and the third direction D3. For convenience of explanation, just one of the bottom pads 11b will be described in the following description. The bottom pad 11b may be electrically connected to the outer connection ball 11s. The outer connection ball 11s may be bonded to the bottom pad 11b. The bottom pad 11b may be electrically connected to the outside through the outer connection ball 11s.

The semiconductor chip 3 may be disposed on the substrate 1. The semiconductor chip 3 may be electrically connected to the upper pad. The semiconductor chip 3 may be electrically connected to the outer connection ball 11s and the upper redistribution layer UR through the upper pad 11u.

The mold layer M may be disposed on the substrate 1. In an embodiment, the mold layer M may be formed of or include at least one insulating material. For example, the mold layer M may be formed of or include epoxy molding compound (EMC). However, embodiments of the present inventive concepts are not limited thereto. The mold layer M may be arranged to enclose the semiconductor chip 3 and/or the conductive pillar 5. For example, as shown in the embodiment of FIG. 1, the mold layer M may be disposed to cover lateral side surfaces and/or a top surface of the semiconductor chip 3. The mold layer M may also be disposed to enclose lateral side surfaces of the conductive pillar 5. The mold layer M may protect the semiconductor chip 3 and/or the conductive pillar 5 from an external impact or the like.

The conductive pillar 5 may have a structure that extends upwardly from the substrate 1 (e.g., in the first direction D1). For example, the conductive pillar 5 may extended from the top surface of the substrate body 11 in the first direction D1. In an embodiment, the conductive pillar 5 may be formed of or include at least one conductive material. For example, the conductive pillar 5 may be formed of or include at least one compound selected from copper (Cu) and nickel (Ni). However, the present inventive concepts are not limited to this example, as will be described in more detail below. As shown in the embodiment of FIG. 1, the conductive pillar 5 may include a connection pillar 51 and the alignment pillar 53.

The connection pillar 51 may be disposed on the upper pad 11u. For example, as shown in the embodiment of FIG. 1, a lower surface of the connection pillar 51 may directly contact an upper surface of the upper pad 11u. The connection pillar 51 may be electrically connected to the upper pad 11u. The semiconductor package P may include a plurality of connection pillars 51. The connection pillars 51 may be spaced apart from each other in the second direction D2 and/or the third direction D3. The connection pillar 51 may be electrically connected to the upper redistribution layer UR. This will be described in more detail below.

The alignment pillar 53 may be spaced apart from the connection pillar 51 in the second direction D2 and/or the third direction D3. The alignment pillar 53 may not be electrically connected to the upper redistribution layer UR. For example, the alignment pillar 53 may not be electrically connected to a redistribution metal pattern RM1 (e.g., see FIG. 3) and a second redistribution metal pattern RM2 (e.g., see FIG. 3). In addition, the alignment pillar 53 may not be electrically connected to the interconnection line in the substrate 1. This will be described in more detail below.

The upper redistribution layer UR may be disposed on the bottom package BP. For example, as shown in the embodiment of FIG. 1, a lower surface of the upper redistribution layer UR may directly contact a lower surface of the bottom package BP. The upper redistribution layer U may electrically connect the bottom package BP to the upper package UP. The upper redistribution layer UR will be described in more detail with reference to the embodiments of FIGS. 3 and 4.

The upper package UP may be disposed on the upper redistribution layer UR. The upper package UP may be electrically connected to the upper redistribution layer UR. The upper package UP may be electrically connected to the bottom package BP through the upper redistribution layer UR.

Figure 3:
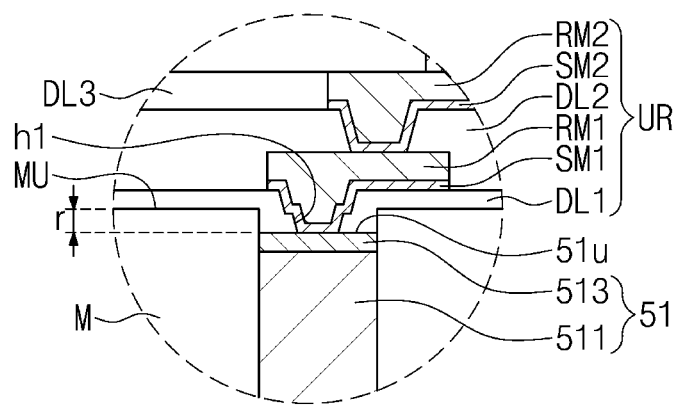
FIG. 3 is an enlarged cross-sectional view illustrating a portion 1A of the semiconductor package of FIG. 1.

FIG. 3 is an enlarged cross-sectional view illustrating a portion 1A of the semiconductor package of FIG. 1.

Referring to the embodiment of FIG. 3, the connection pillar 51 may include a first metal portion 511 and a second metal portion 513. The first metal portion 511 may be extend upwardly (e.g., in the first direction D1) from the substrate 1 (e.g., see FIG. 1). In an embodiment, the first metal portion 511 may be formed of or include copper (Cu). The second metal portion 513 may be disposed on the first metal portion 511. For example, as shown in the embodiment of FIG. 3, a lower surface of the second metal portion 513 may directly contact an upper surface of the first metal portion 511. The second metal portion 513 may be formed of or include a material that is different from the first metal portion 511. For example, the second metal portion 513 may be formed of or include nickel (Ni). However, embodiments of the present inventive concepts are not limited thereto and the second metal portion 513 may be formed of or include various different materials that have an etch selectivity with respect to a material of the first metal portion 511. A top surface 51u of the second metal portion 513 may serve as a top surface of the connection pillar 51. The top surface 51u of the second metal portion 513 may have a level (e.g., distance from a top surface of the substrate body 11 in the first direction D1) that is lower than a level of a top surface MU of the mold layer M. As shown in the embodiment of FIG. 3, a height difference r between the top surface 51u of the second metal portion 513 and the top surface MU of the mold layer M may be less than about 5 μm. For example, in an embodiment, the height difference r between the top surface 51u of the second metal portion 513 and the top surface MU of the mold layer M may be less than about 3 μm.

As shown in the embodiment of FIG. 3, the upper redistribution layer UR may include an interfacial layer DL1, a seed-barrier layer SM1, the redistribution metal pattern RM1, a first insulating layer DL2, a second seed-barrier layer SM2 the second redistribution metal pattern RM2, and a second insulating layer DL3.

The interfacial layer DL1 may be disposed on the top surface MU of the mold layer M and a partial portion of the top surface 51u of the second metal portion 513. In an embodiment, the interfacial layer DL1 may be formed of or include at least one of insulating materials. For example, the interfacial layer DL1 may be formed of or include a photo-sensitive polymer. In an embodiment, the interfacial layer DL1 may be formed of or include at least one material selected from photo-sensitive polyimide, poly benzoxazole phenolic polymer, and/or benzocyclobutene polymers. However, embodiments of the present inventive concepts are not limited thereto, and the interfacial layer DL1 may include various other materials. The interfacial layer DL1 may include a connection opening h1. The connection opening h1 may be disposed on the connection pillar 51. The connection opening h1 may expose the top surface 51u of the second metal portion 513, when viewed in a plan view (e.g., in a plane defined in the second and third directions D2, D3). For example, when viewed in a plan view, the connection opening h1 may expose a partial portion of the second metal portion 513 such that the entire portion of the top surface 51u of the second metal portion 513 is not covered with the interfacial layer DL1. Thus, the partial portion of the top surface 51u of the second metal portion 513 exposed by the connection opening h1 may be in direct contact with the seed-barrier layer SM1 and may not directly contact the interfacial layer DL1. For example, as shown in the embodiment of FIG. 3, a lower surface of the seed-barrier layer SM1 may directly contact the exposed portion of the top surface 51u of the second metal portion 513. Thus, the second metal portion 513 may be electrically connected to the seed-barrier layer SM1. A length of the connection opening h1 in a horizontal direction (e.g., the second direction D2) may be less than the length of the connection pillar 51 in the horizontal direction. For example, in an embodiment in which the connection pillar 51 and the connection opening h1 are circular when viewed in a plan view (e.g., in a plane defined in the second and third directions D2, D3), a diameter of the connection opening h1 may be less than a diameter of the connection pillar 51. A lower portion of the seed-barrier layer SM1 may be disposed in the connection opening h1. A length of the lower portion of the seed-barrier leer SM1 disposed in the connection opening h1 and contacting the top surface 51u of the second metal portion 513 in the horizontal direction may be less than a length of the connection pillar 51 in the horizontal direction. This will be described in more detail with reference to the embodiments of FIGS. 12 and 15.

A partial portion of the seed-barrier layer SM1 may be disposed on the second metal portion 513 of the connection pillar 51. In addition, a partial portion of the seed-barrier layer SM1 may be disposed on the interfacial layer DL1. For example, as shown in the embodiment of FIG. 3, a partial portion of a lower surface of the seed-barrier layer SM1 may directly contact a surface of the interfacial layer DL1 adjacent to the connection opening h1. The seed-barrier layer SM1 may electrically connect the connection pillar 51 to the redistribution metal pattern RM1. The seed-barrier layer SM1 may be formed of or include at least one conductive material. For example, in an embodiment, the seed-barrier layer SM1 may be formed of or include at least one compound selected from copper (Cu) and titanium (Ti). However, embodiments of the present inventive concepts are not limited thereto.

The redistribution metal pattern. RM1 may be disposed on the seed-barrier layer SM1. For example, as shown in the embodiment of FIG. 3, a lower surface of the redistribution metal pattern RM1 may directly contact an upper surface of the seed-barrier layer SM1. The redistribution metal pattern RM1 may be formed of or include at least one conductive material. For example, the redistribution metal pattern RM1 may be formed of or include copper (Cu). However, embodiments of the present inventive concepts are not limited thereto. The redistribution metal pattern RM1 may be electrically connected to the connection pillar 51 through the seed-barrier layer SM1.

The first insulating layer DL2 may cover the redistribution metal pattern RM1. For example, as shown in the embodiment of FIG. 3, the first insulating layer DL2 may cover lateral side surfaces and a partial portion of the top surface of the redistribution metal pattern RM1. The first insulating layer DL2 may electrically disconnect the redistribution metal pattern RM1 from other elements. In an embodiment, the first insulating layer DL2 mays be formed of or include a photo-sensitive polymer. For example, the first insulating layer DL2 may be formed of or include at least one material selected from photo-sensitive polyimide, poly benzoxazole, phenolic polymer, and/or benzocyclobutene polymers. However, embodiments of the present inventive concepts are not limited thereto and the first insulating layer DL2 may be formed of or include various other materials.

The second seed-barrier layer SM2 may be disposed on the redistribution metal pattern RM1. For example, as shown in the embodiment of FIG. 3, a lower surface of the second seed-barrier layer SM2 may directly contact the partial portion of the upper surface of the redistribution metal pattern RM1 that is not covered by the first insulating layer DL2. In an embodiment, the second seed-barrier layer SM2 may be formed of or include a material that is substantially the same as or similar to the seed-barrier layer SM1. The second seed-barrier layer SM2 may electrically connect the second redistribution metal pattern RM2 to the redistribution metal pattern RM1.

The second redistribution metal pattern RM2 may be disposed on the second seed-barrier layer SM2. For example, as shown in the embodiment of FIG. 3, a lower surface of the second redistribution metal pattern RM2 may directly contact an upper surface of the second seed-barrier layer SM2. In an embodiment, the second redistribution metal pattern RM2 may be formed of or include a material that is substantially the same as or similar to the redistribution metal pattern RM1. The second redistribution metal pattern RM2 may be electrically connected to the redistribution metal pattern RM1 through the second seed-barrier layer SM2.

The second insulating layer DL3 may cover at least one lateral side surface of the second redistribution metal pattern RM2. In an embodiment, the second insulating layer DL3 may be formed of or include a material that is substantially the same as or similar to the first insulating layer DL2.

Figure 4:
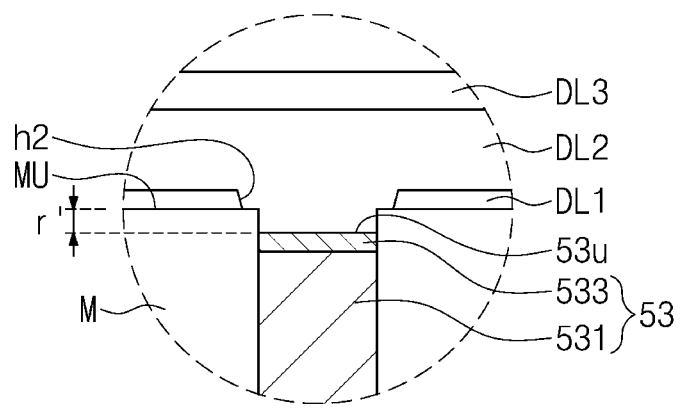
FIG. 4 is an enlarged cross-sectional view illustrating a portion 1B of the semiconductor package of FIG. 1.

FIG. 4 is an enlarged cross-sectional view illustrating a portion 1B of the semiconductor package of FIG. 1.

Referring to FIG. 4, the alignment pillar 53 may include a first metal portion 531 and a second metal portion 533. The first metal portion 531 of the alignment pillar 53 may be configured to have substantially the same or similar features as those of the first metal portion 511 of the connection pillar 51 described with reference to the embodiment of FIG. 3. The second metal portion 533 of the alignment pillar 53 may be formed of or include substantially the same or similar material as the second metal portion 513 of the connection pillar 51 described with reference to the embodiment of FIG. 3. A top surface 53u of the second metal portion 533 may serve as a top surface of the alignment pillar 53. As shown in the embodiment of FIG. 4, a level of the top surface 53u of the second metal portion 533 may be lower than a level of the top surface MU of the mold layer M. In an embodiment, a height difference r' between the top surface 53u of the second metal portion 533 and the top surface MU of the mold layer M may be less than about 5 μm. For example, the height difference r' between the top surface 53u of the second metal portion 533 and the top surface MU of the mold layer M may be less than about 3 μm.

The interfacial layer DL1 may be arranged to define an alignment opening h2. The alignment opening h2 may be disposed on the alignment pillar 53. The alignment opening h2 may be formed to expose the top surface 53u of the second metal portion 533, when viewed in a plan view (e.g., in a plane defined in the second and third directions D2, D3). For example, when viewed in a plan view, the alignment opening h2 may expose a partial portion of the second metal portion 533 such that the entire portion of the top surface 53u of the second metal portion 533 is not covered with the interfacial layer DL1. Thus, the top surface 53u of the second metal portion 533 may be in direct contact with the first insulating layer DL2 and does not contact the interfacial layer DL1. As shown in the embodiment of FIG. 4, the entire portion of the top surface 53u of the second metal portion 533 may be in contact with the first insulating layer DL2. For example, the entire portion of the top surface 53u of the second metal portion 533 may directly contact a lower surface of the first insulating layer DL2. A length of the alignment opening b2 in a horizontal direction (e.g., the second direction D2) may be greater than length of the alignment pillar 53 in the horizontal direction. For example, the alignment opening h2 may be defined in portions of the interfacial layer DL1 disposed above the mold layer M and an entire length of the alignment opening h2 in a horizontal direction is greater than an entire length of the alignment pillar 53 in the horizontal direction. In an embodiment in which the alignment pillar 53 and the alignment opening h2 are circular when viewed in a plan view (e.g., in a plane defined in the second and third directions D2, D3), a diameter of the alignment opening IC may be greater than a diameter of the alignment pillar 53. Thus, the entire portion of the top surface 53u of the second metal portion 533 may be in direct contact with the first insulating layer DL2. In addition, a partial portion of the top surface MU of the mold layer M may also be exposed through the alignment opening h2, when viewed in a plan view. For example, the portion of the alignment opening h2 defined in the interfacial layer DL1 may expose a partial portion of the top surface MU of the mold layer M. The partial portion of the top surface MU of the mold layer M exposed by the alignment opening h2 may be in direct contact with the first insulating layer DL2. This will be described in we detail with reference to FIG. 13.

Figure 5:
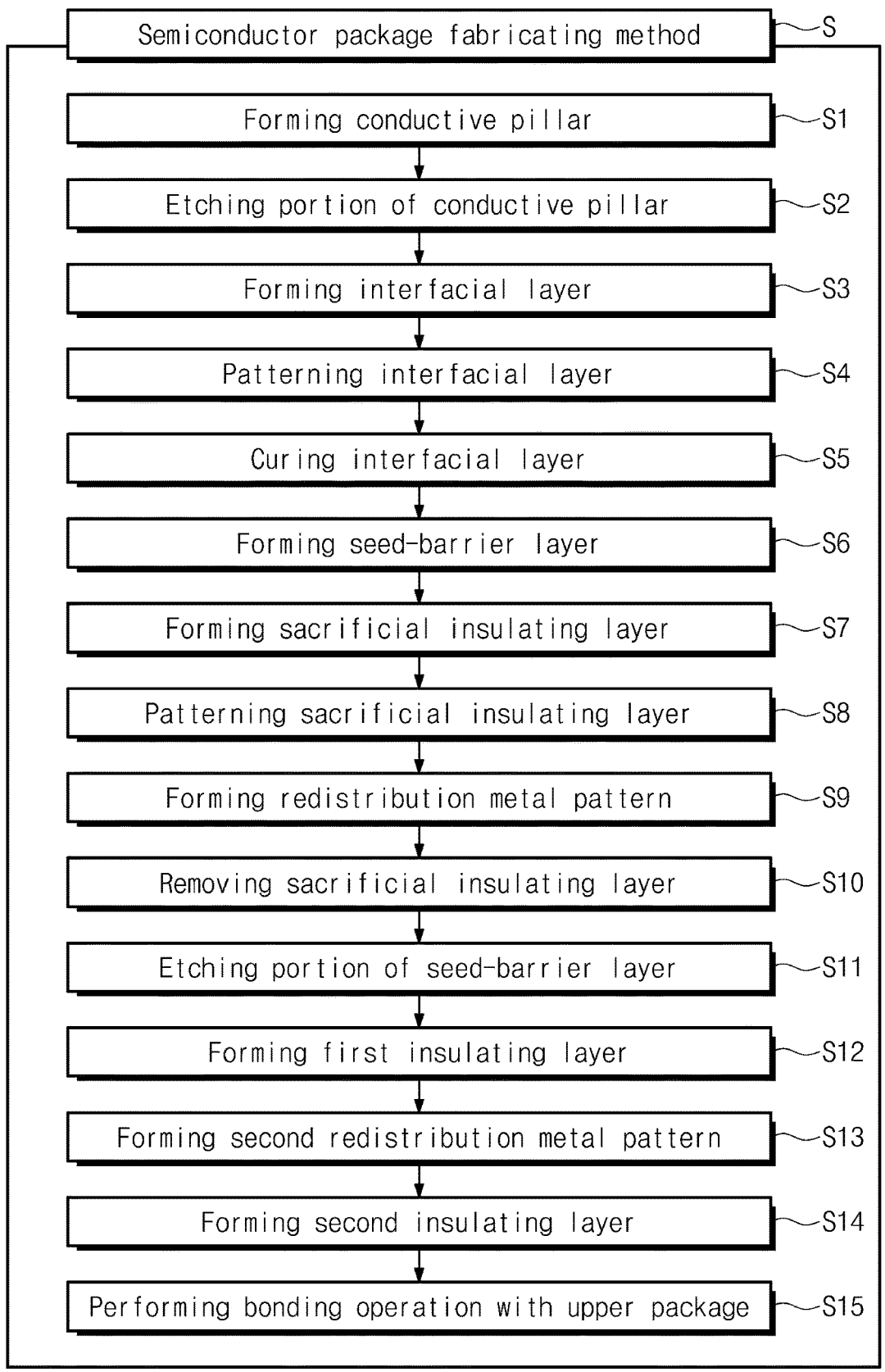
FIG. 5 is a flow chart illustrating a method of fabricating a semiconductor package, according to an embodiment of the present inventive concepts.

FIG. 5 is a flow chart illustrating a method of fabricating a semiconductor package, according to an embodiment of the present inventive concepts.

Referring to the embodiment of FIG. 5, a method of fabricating a semiconductor package in block 5 may include forming a conductive pillar in block S1, etching a portion of the conductive pillar in block S2, forming an interfacial layer in block S3, patterning an interfacial layer in block S4, curing the interfacial layer in block S5, forming a seed-barrier layer in block S6, forming a sacrificial insulating layer in block S7, patterning the sacrificial insulating layer in block S8, forming a redistribution metal pattern in block S9, removing the sacrificial insulating layer in block S10, etching a portion of the seed-barrier layer in block S11, forming a first insulating layer in block S12, forming a second redistribution metal pattern in block S13, forming a second insulating layer in block S14, and performing a bonding operation with an upper package in block S15.

In the following description, each of the steps in the fabrication method S will be described in more detail with reference to the embodiments of FIGS. 6 to 25.

FIGS. 6 to 25 are cross-sectional views illustrating a process of fabricating a semiconductor package using a fabrication method according to an embodiment of the present inventive concepts.

Figure 6:
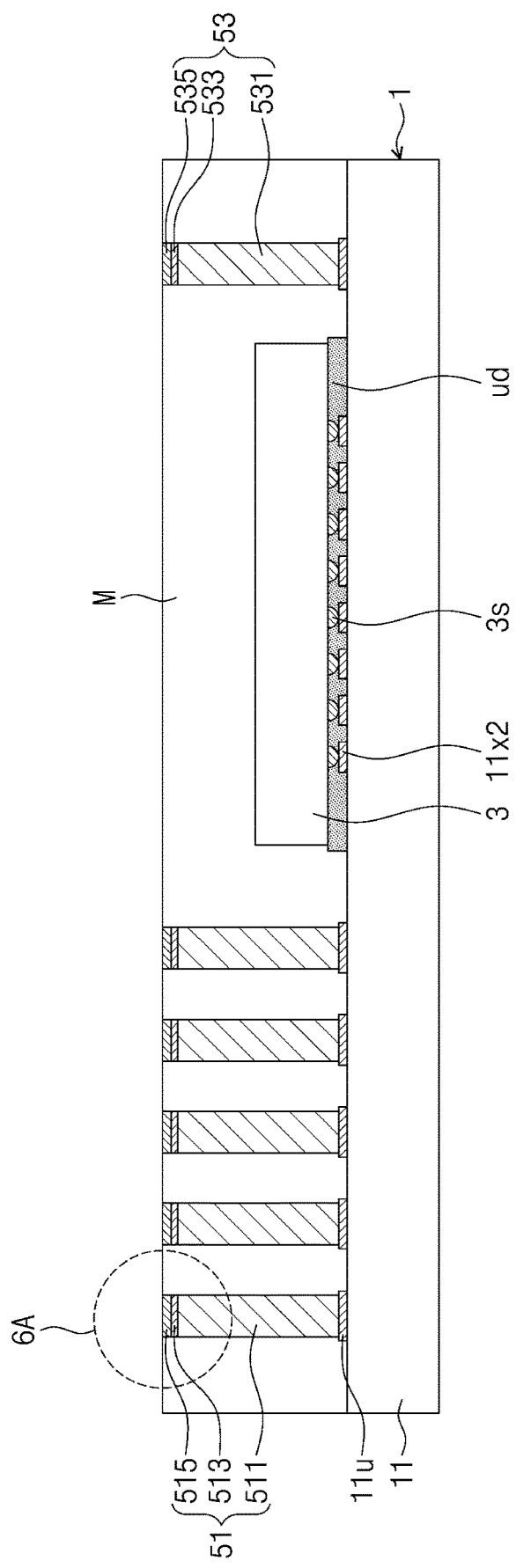
FIGS. 6, 8, 10-11, 14, 16-23 and 25 are cross-sectional views illustrating a process of fabricating a semiconductor package, using a fabrication method according to an embodiment of the present inventive concepts.

Referring to FIGS. 6 and 5, the substrate 1 may further include a chip connection pad 11×2. The semiconductor chip 3 may include a chip connection ball 3s. The chip connection ball 3s may be bonded to the chip connection pad 11×2. An under fill ud may be formed between the substrate 1 and the semiconductor chip 3 to enclose the chip connection ball 3s and for the chip connection pad 11×2.

The forming of the conductive pillar in block S1 may be performed to form the connection pillar 51 and the alignment pillar 53. In an embodiment, the connections 51 and the alignment pillar 53 may be formed by an electroplating process or the like. However, embodiments of the present inventive concepts are not limited to this process.

Figure 7:
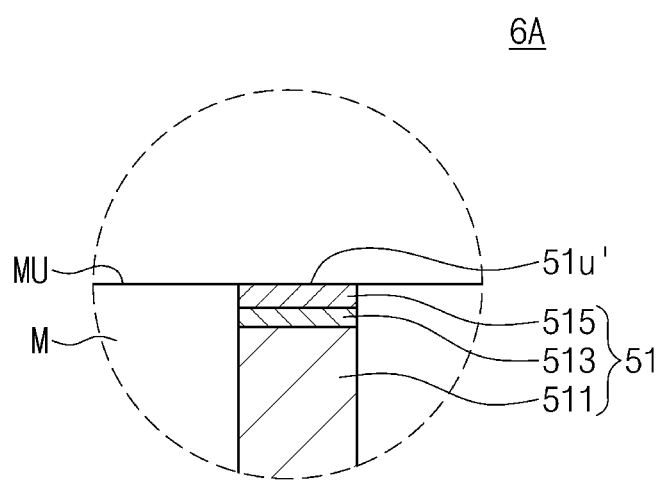
FIG. 7 is an enlarged cross-sectional view illustrating a portion 6A of the semiconductor package of FIG. 6.

The connection pillar 51 may further include a third metal portion 515, in addition to first metal portion 511 and the second metal portion 513. The third metal portion 515 may be disposed on the second metal portion 513. For example, as shown in the embodiment of FIG. 7, a lower surface of the third metal portion 515 of the connection pillar 51 may directly contact an upper surface of the second metal portion 513. The alignment pillar 53 may further include a third metal portion 535, in addition to the first metal portion 531 and the second metal portion 533. The third metal portion 535 may be disposed on the second metal portion 533. For example, a lower surface of the third metal portion 535 of the alignment pillar 53 may directly contact an upper surface of the second metal portion 513.

Referring to the embodiment of FIG. 7, a top surface 51u' of the third metal portion 515 of the connection pillar 51 may be formed to be substantially coplanar with the top surface MU of the mold layer M.

Figure 8:
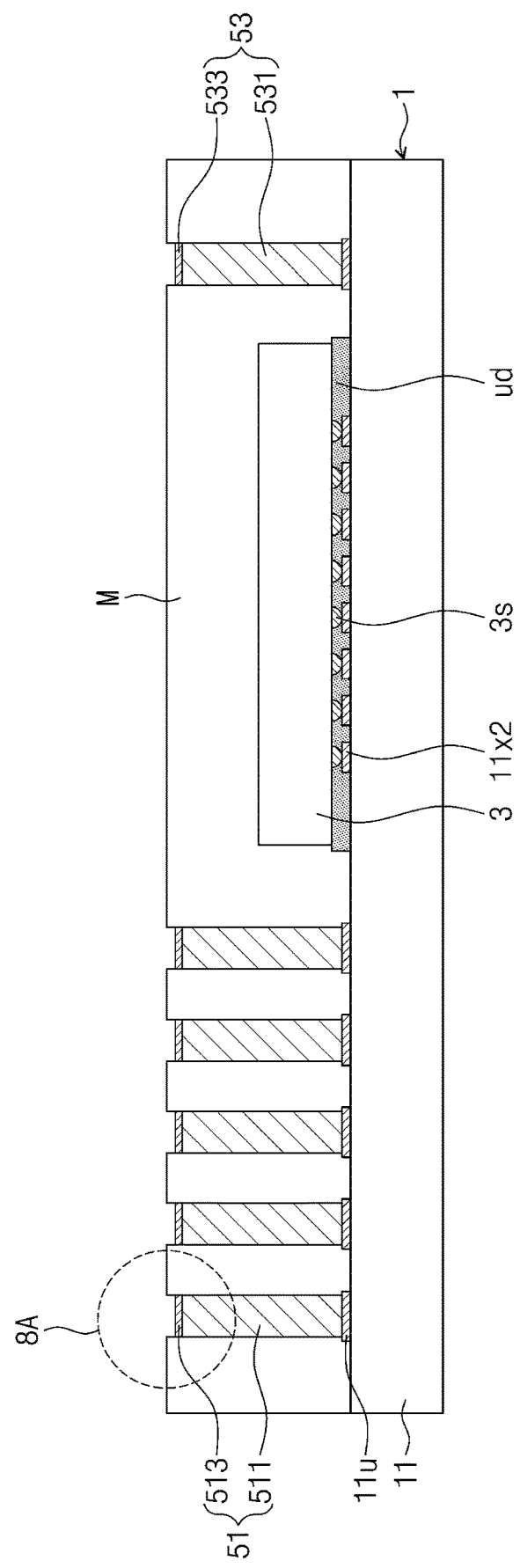

Referring to the embodiments of FIGS. 8 and 5, the etching, of the portion of the conductive pillar in block S2 may include etching upper portions of the connection and alignment pillars 51 and 53. In an embodiment, the etching process may include a wet etching process. The etching process may be performed to expose the second metal portion 513 of the connection pillar 51 and the second metal portion 533 of the alignment pillar 53. In an embodiment in which the second metal portions 513 and 533 of the connection pillar 51 and the alignment pillar 53 have etch selectivity with respect to the first metal portions 511 and 531 of the connection pillar 51 and the alignment pillar 53, respectively, the etching process may not be performed after the second metal portions 513 and 533 of the connection pillar 51 and the alignment pillar 53 are exposed. The third metal portion 515 (e.g., see FIG. 6) of the connection pillar 51 and the third metal portion 535 (e.g., see FIG. 6) of the alignment pillar 53 may be removed by the etching process.

Figure 9:
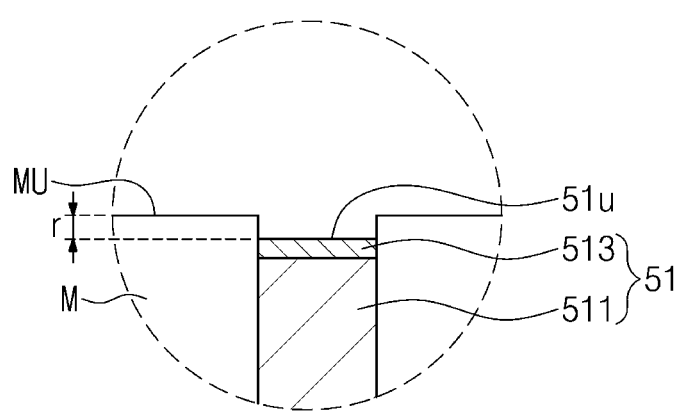
FIG. 9 is an enlarged cross-sectional view illustrating a portion 8A of the semiconductor package of FIG. 8.

Referring to the embodiment of FIG. 9, since the third metal portion 515 of the connection pillar 51 is removed by the etching process, the second metal portion 513 of the connection pillar 51 may be exposed to the outside. A level of the top surface 51u of the second metal portion 513 may be lower than a level of the top surface MU of the mold layer M.

Figure 10:
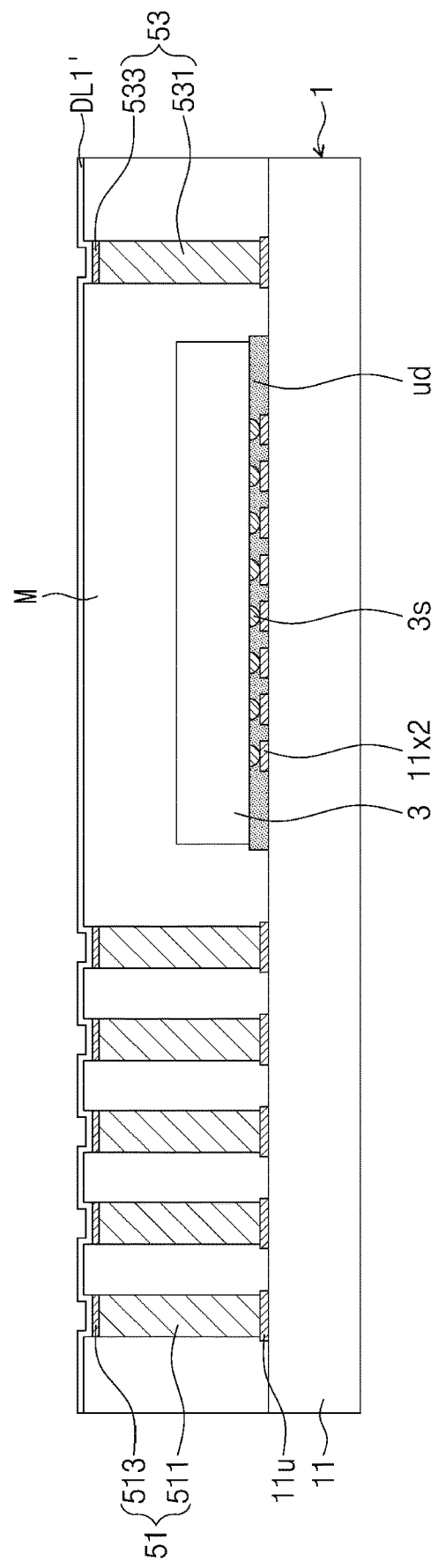

Referring to the embodiments of FIGS. 10 and 5, the forming of the interfacial layer in block S3 may include forming a preliminary interfacial layer DL1' on upper surfaces of the mold layer M, the second metal portion 513 of the connection pillar 51, and the second metal portion 533 of the alignment pillar 53. In an embodiment, the formation of the preliminary interfacial layer DL1' may be performed by a coating process, such as a spin coating process or a slit coating process.

Figure 11:
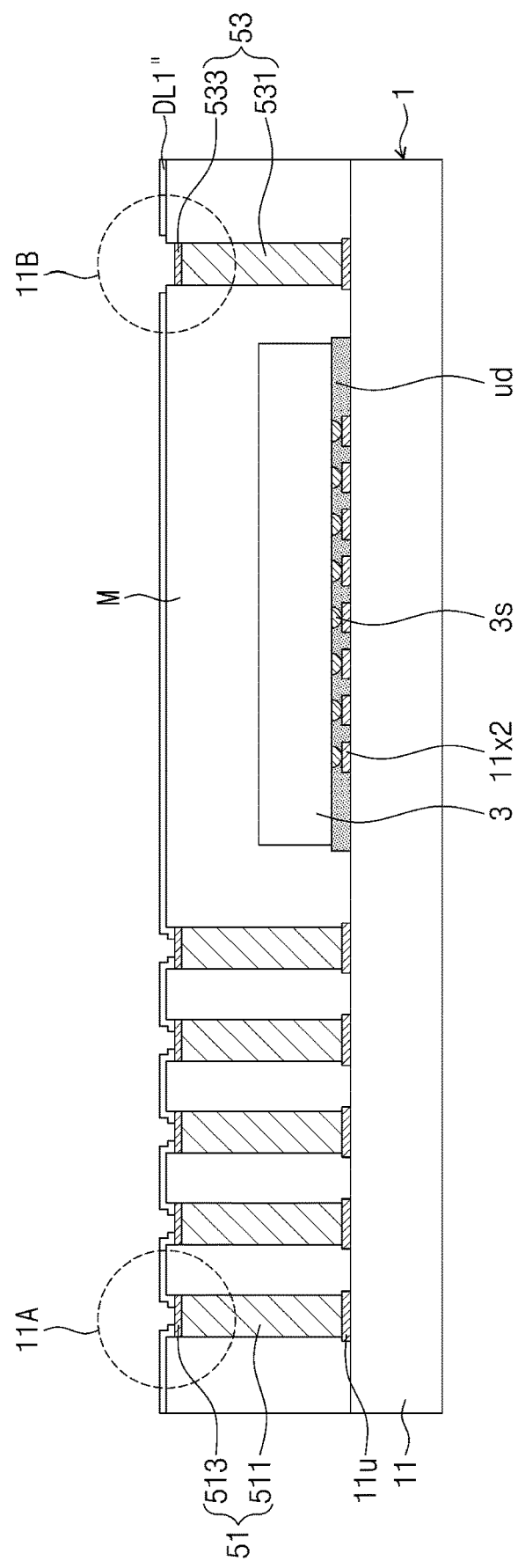

Referring to the embodiments of FIGS. 11 and 5, the patterning of the interfacial layer in block S4 may include patterning the preliminary interfacial layer DL1' to form an opening. In an embodiment, the patterning of the preliminary interfacial layer DL1' may be performed by an exposure and developing process. For example, the developing process may be a positive tone developing process or a negative tone developing process. The patterned interfacial layer will be referred to as the patterned interfacial layer DL1".

Figure 12:
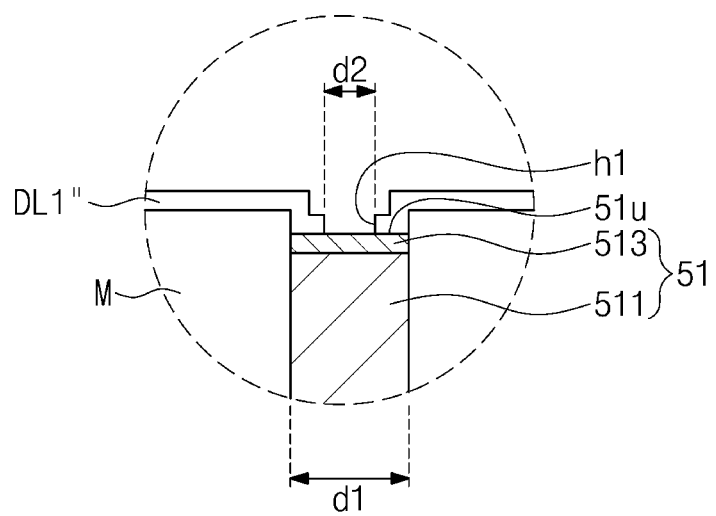
FIG. 12 is an enlarged cross-sectional view illustrating a portion 11A of the semiconductor package of FIG. 11.

Referring to the embodiment of FIG. 12, the patterned interfacial layer DL1" may be formed to have the connection opening h1. The top surface 51u of the connection pillar 51 may be exposed to the outside through the connection opening h1, when viewed in a plan view (e.g., in a plane defined in the second and third directions D2, D3). A length d2 of the connection opening h1 in the horizontal direction (e.g., the second direction D2) may be less than a length d1 of the connection pillar 51 in the horizontal direction. Thus, the top surface 51u of the connection pillar 51 may have two portions, each of which is covered with the patterned interfacial layer DL1", and the other of which is exposed to the outside. For example, as shown in the embodiment of FIG. 12, the lateral ends of the top surface 51u of the connection pillar 51 may be covered with the patterned interfacial layer DL1" and the central portion formed therebetween may be exposed to the outside.

Figure 13:
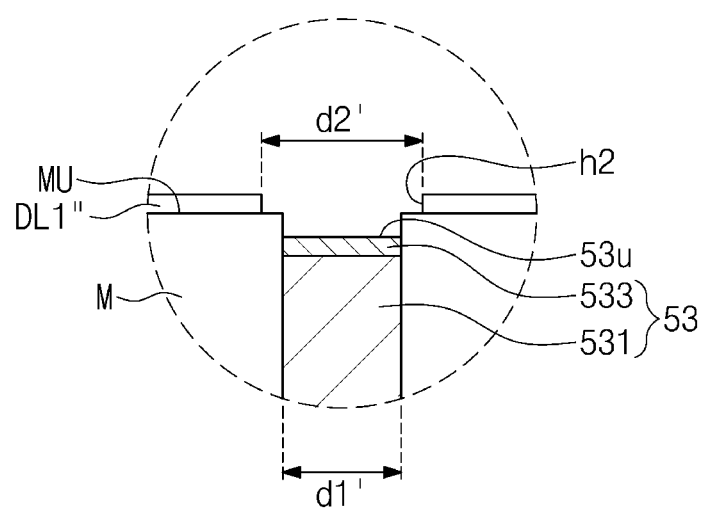
FIG. 13 is an enlarged cross-sectional view illustrating a portion 11B of the semiconductor package of FIG. 11.

Referring to the embodiment of FIG. 13, the patterned interfacial layer DL1" may also be formed to have the alignment opening h2. The top surface 53u of the alignment pillar 53 may be exposed to the outside through the alignment opening h2, when viewed in a plan view. For example, as shown in the embodiment of FIG. 13, an entire portion of the top surface 53u of the alignment pillar 53 may be exposed to the outside through the alignment opening h2. A length d2' of the alignment opening h2 in the horizontal direction (e.g., the second direction D2) may be greater than a length d1' of the alignment pillar 53 in the horizontal direction. Thus, the entire portion of the top surface 53u of the alignment pillar 53 may be fully exposed to the outside when viewed in a plan view. In addition, the alignment opening h2 may be further defined in the interfacial layer DL1 disposed above the mold layer M and a partial portion of the top surface MU of the mold layer M may also be exposed through the alignment opening h2, when viewed in a plan view (e.g., in a plane defined in the second and third directions D2, D3).

Figure 14:
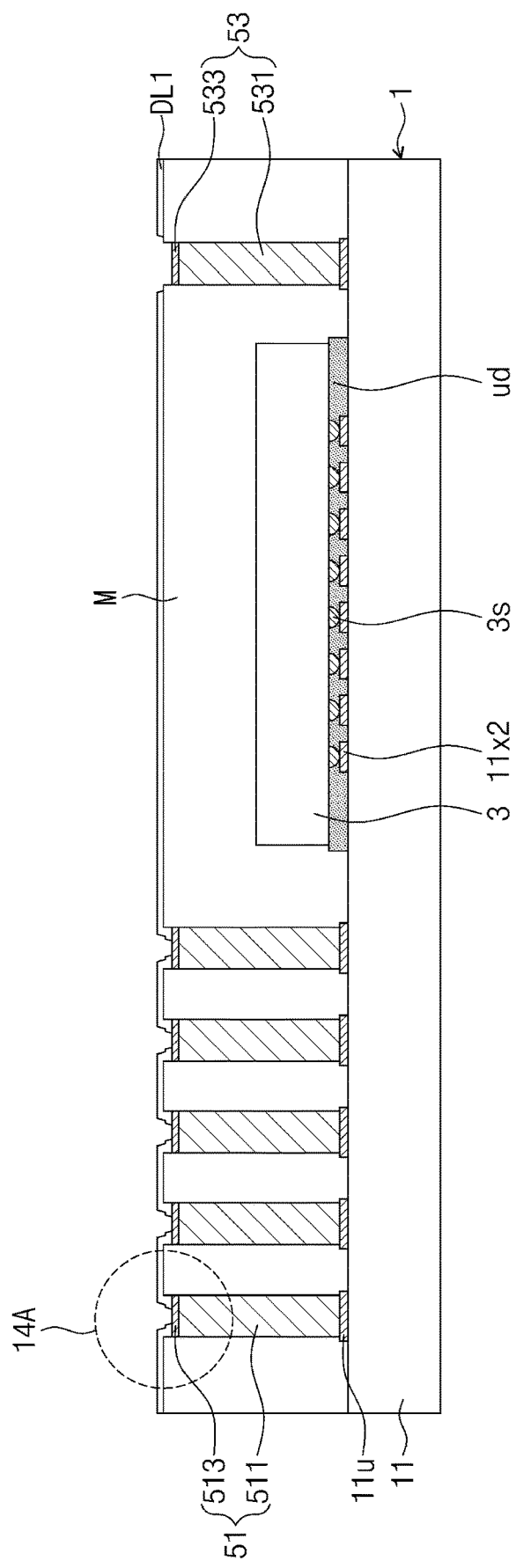

Referring to the embodiments of FIGS. 14 and 5, the curing of the interfacial layer (in S5) may include curing the patterned interfacial layer DL1" (e.g., see FIG. 11). The interfacial layer DL1 described with reference to the embodiment of FIG. 2 may be formed when the curing step is finished.

Figure 15:
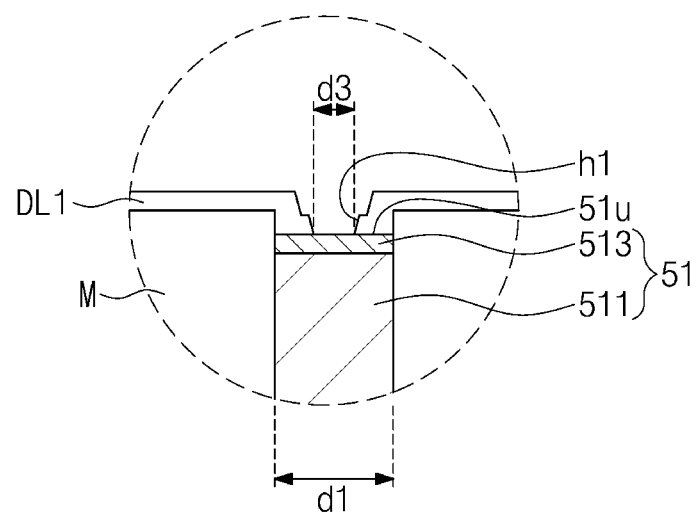
FIG. 15 is an enlarged cross-sectional view illustrating a portion 14A of the semiconductor package of FIG. 14.

Referring to the embodiment of FIG. 15, the interfacial layer DL1 may be deformed during the curing step. For example, a sidewall of the interfacial layer DL1 defining the connection opening h1 may be deformed. The interfacial layer DL1 may collapse such that the sidewall thereof is inclined at an angle with respect to a vertical direction. A length d3 of the connection opening h1 in the horizontal direction may be changed from the length d2 after the patterning step in block S4. For example, the length d3 of the connection opening h1 in the horizontal direction after the curing step may be less than the length d2 of the connection opening h1 in the horizontal direction after the patterning step in block S4.

Figure 16:
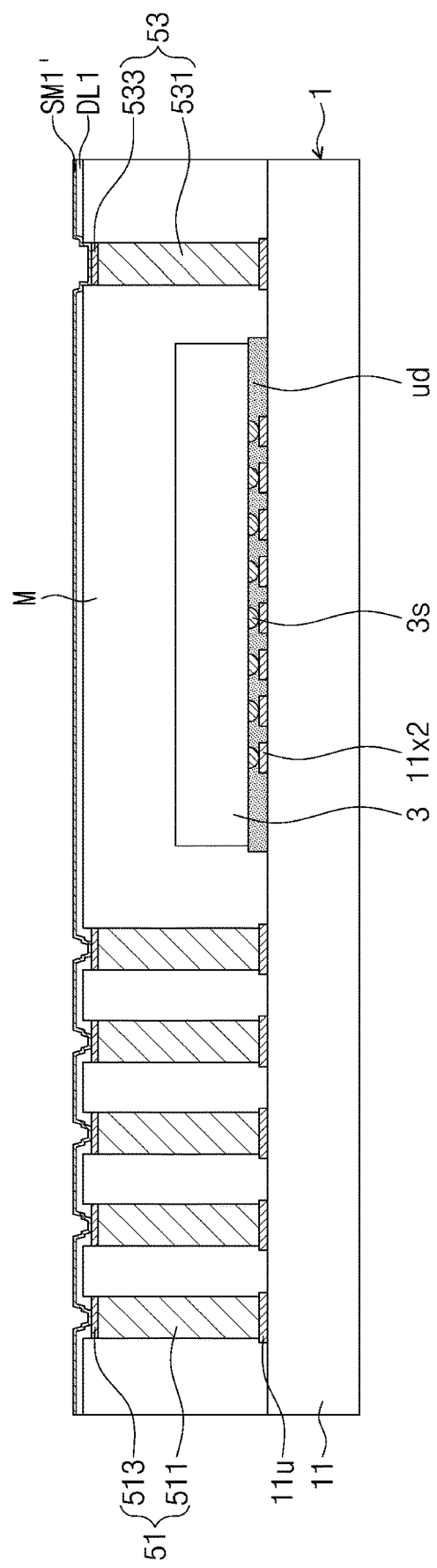

Referring to the embodiments of FIGS. 16 and 5, the funning of the seed-barrier layer in block S6 may include forming a preliminary seed-barrier layer SM1' on the interfacial layer DL1, an upper surface of the second metal portion 513 of the connection pillar 51, and an upper surface of the second metal portion 533 of the alignment pillar 53. The preliminary seed-barrier layer SM1' may be formed to conformally cover the interfacial layer DL1, the second metal portion 513 of the connection pillar 51, and the second metal portion 533 of the alignment pillar 53. In an embodiment, the forming of the seed-barrier layer in block S6 may be performed using a deposition process.

Figure 17:
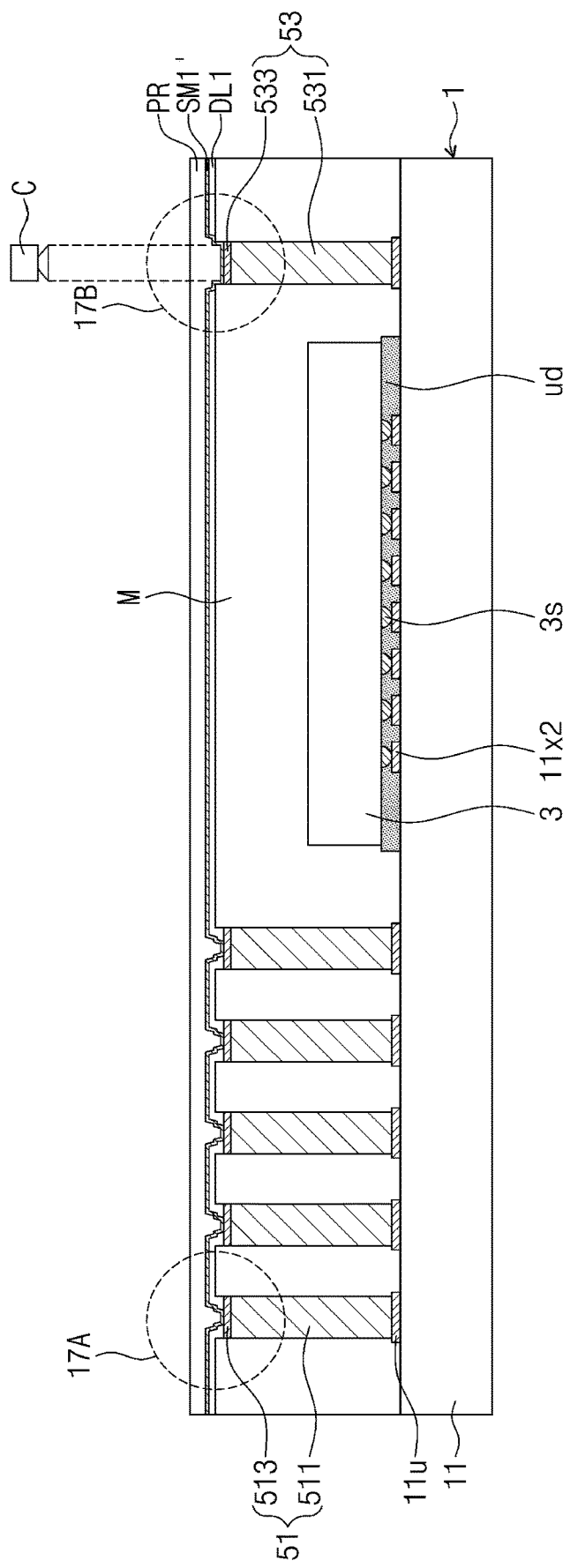

Referring to the embodiments of FIGS. 17 and 5, the forming of the sacrificial insulating layer in block S7 may include forming a sacrificial insulating layer PR on the an upper surface of the preliminary seed-barrier layer SM1'. In an embodiment, the sacrificial insulating layer PR may be formed of or include a photo-sensitive polymer. For example, the sacrificial insulating layer PR may be formed of or include at least one material selected from photosensitive polyimide, poly benzoxazole, phenolic polymer, and benzocyclobutene polymers. However, embodiments of the present inventive concepts are not limited thereto, and the sacrificial insulating layer PR may be formed of or include various other materials. In an embodiment, the forming of the sacrificial insulating layer PR may be performed using a coating process, such as a spin coating process or a slit coating process.

Referring back to the embodiment of FIG. 5, the patterning of the sacrificial insulating layer in block S8 may be performed through an exposure and developing process. In an embodiment, the developing process may be a positive tone developing process or a negative tone developing process. The patterning of the sacrificial insulating layer in block S8 may include aligning a photomask on the sacrificial insulating layer, performing an exposure process on the sacrificial insulating layer, and then performing a developing process on the exposed sacrificial insulating layer.

Referring back to the embodiment of FIG. 17, the aligning of the photon ask to the sacrificial insulating layer may include finding an alignment mark. In an embodiment, the finding of the alignment mark may include placing an alignment camera C over the alignment pillar 53 to find an alignment mark. The alignment mark may be identified on the alignment pillar 53 using the alignment camera C. The alignment camera C may be configured to recognize the preliminary seed-barrier layer SM1', which is located below the sacrificial insulating layer PR, using an electromagnetic wave that passes through the sacrificial insulating layer PR.

Figure 18:
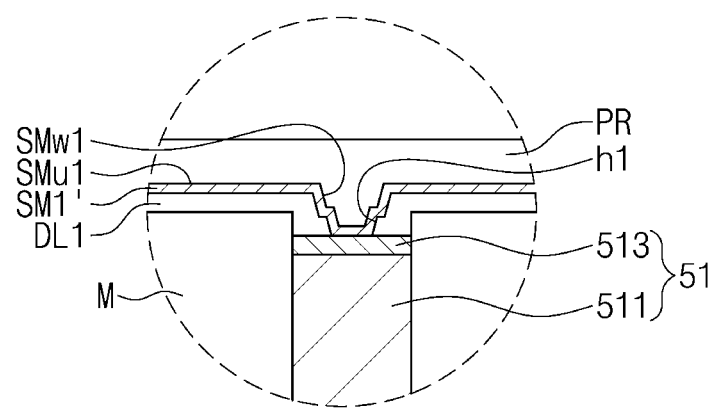

Referring to the embodiment of FIG. 18, the interfacial layer DL1 may be disposed on the connection pillar 51. As a result of the curing process, the interfacial layer DL1 may be in a deformed state. Therefore, the preliminary seed-barrier layer SM1' formed on the deformed interfacial layer DL1 may have an inclined portion. For example, on the connection pillar 51, a lateral side surface SMw1 of the preliminary seed-barrier layer SM1' may not be perpendicular to a top surface SMu1 of the preliminary seed-barrier layer SM1'.

Figure 19:
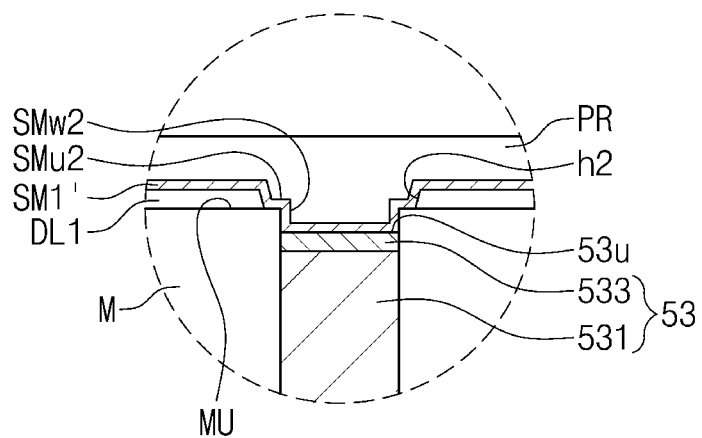

Referring to FIG. 19, the interfacial layer DL1 may not be disposed on the alignment pillar 53. For example, as shown in the embodiment of FIG. 19, the entire top surface 53u of the alignment pillar 53 and a partial portion of the top surface MU of the mold layer M that is adjacent to the top surface 53u in a horizontal direction may be in direct contact with the preliminary seed-barrier layer SM1' through the alignment opening h2. A top surface SMu2 of the partial portion of the preliminary seed-barrier layer SM1' in contact with the top surface MU of the mold layer M may be substantially perpendicular to a side surface SMw2 of a portion of the preliminary seed-barrier layer SM in contact with the top surface 53u of the second metal portion 533. Thus, the preliminary seed-barrier layer SM1', which is in contact with the top surface 53u of the alignment pillar 53 and the top surface MU of the mold layer M, may be used as an alignment mark. The alignment camera C (e.g., see FIG. 17) may be configured to recognize a difference in a vertical level between the side and top surfaces SMw2 and SMu2 of the preliminary seed-barrier layer SM1', on the alignment pillar 53. The difference in vertical level can be more accurately recognized when the alignment camera C is located on the alignment pillar 53 than when it is located on the connection pillar 51 (e.g., see FIG. 18). The alignment camera C may not recognize the connection pillar 51 since the lateral side surface SMw1 of the preliminary seed-barrier layer SM1' inclined and may not be perpendicular to the top surface SMu1 of the preliminary seed-barrier layer SM1'. Thus, since the alignment mark on the alignment pillar 53 can be accurately recognized by the alignment camera C, it may be possible to find a position, at which a photomask will be placed. The photomask may be accurately aligned at a desired position of an underlying structure.

Figure 20:
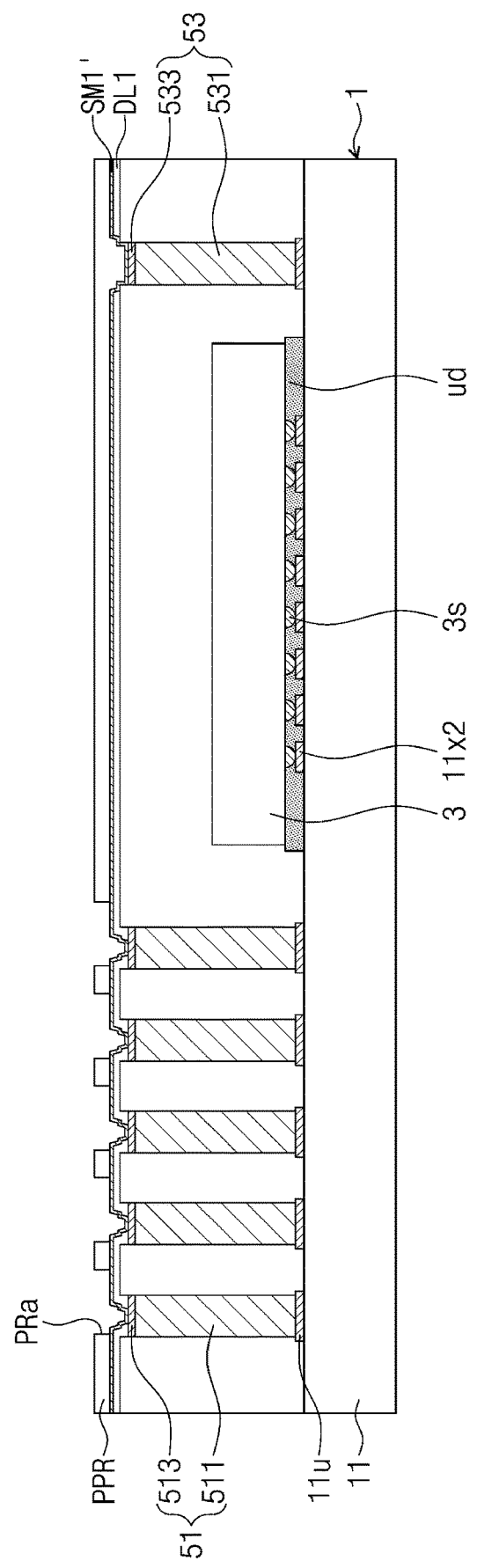

Referring to the embodiment of FIG. 20, the sacrificial insulating layer may be patterned using the photomask that is aligned using the alignment mark. As a result, a patterned sacrificial insulating layer PPR may be formed to have a pattern PRa on the connection pillar 51. The pattern PRa may be formed to expose a portion of the preliminary seed-barrier layer SM1'.

Figure 21:
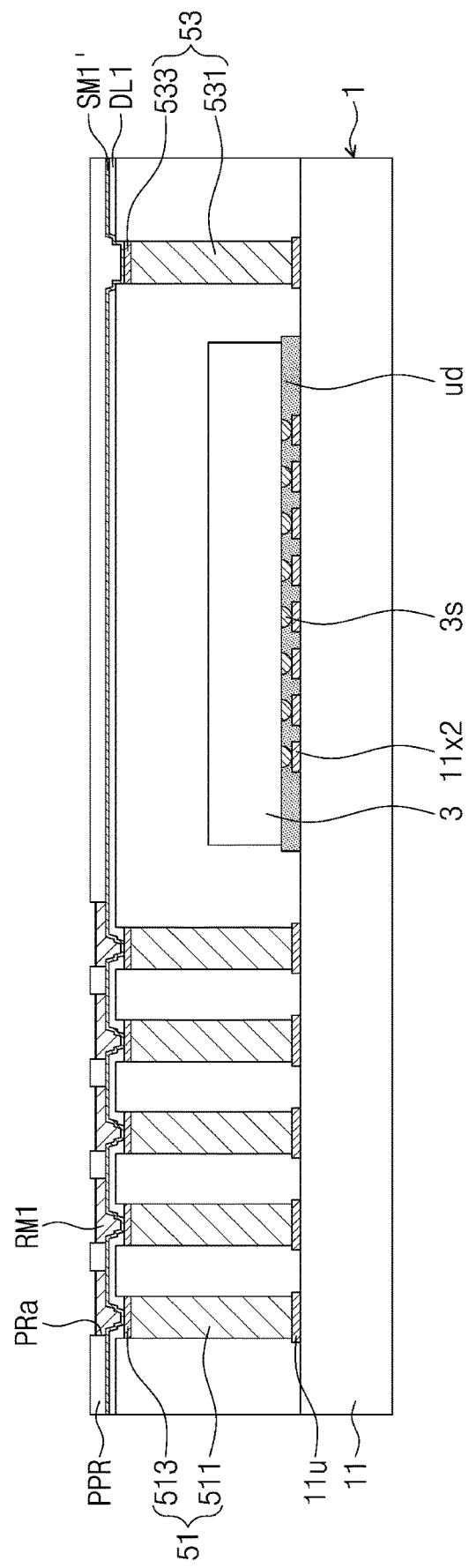

Referring to the embodiments of FIGS. 21 and 5, the forming of the redistribution metal pattern in block S9 may include forming the redistribution metal pattern RM1 in the pattern PRa of the patterned sacrificial insulating layer PPR. In an embodiment, the forming of the redistribution metal pattern in block S9 may be performed using, an electroplating process. In the electroplating process, the preliminary seed-barrier layer SM1' may be used as an electrode.

Figure 22:
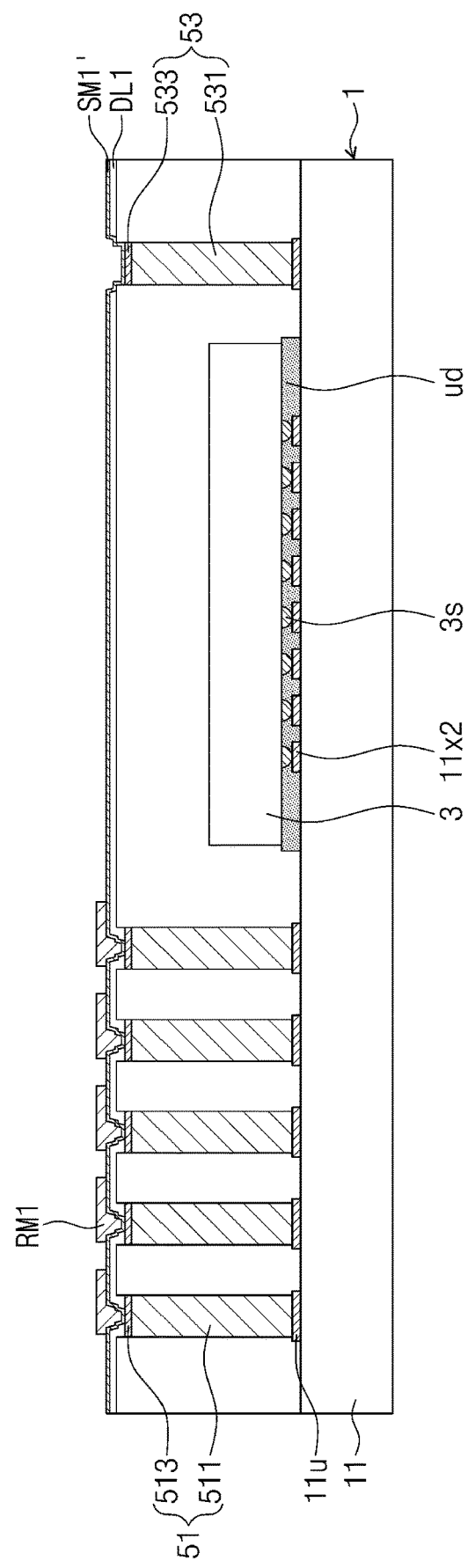

Referring to the embodiments of FIGS. 22 and 5, the removing of the sacrificial insulating layer in block S10 may include removing the patterned sacrificial insulating layer PPR (e.g., see FIG. 21) from the top surface of the preliminary seed-barrier layer SM1'. In an embodiment, the removing of the sacrificial insulating layer (in S10) may be performed using a strip process.

Figure 23:
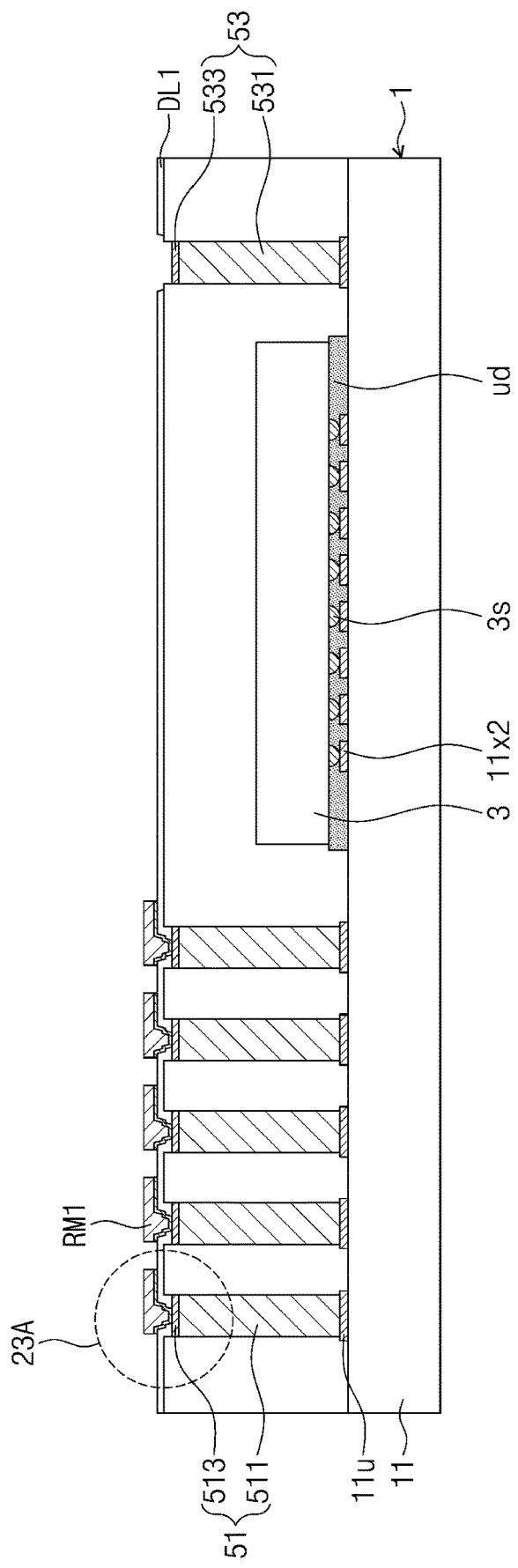

Referring to the embodiments of FIGS. 23 and 5, the partial etching of the seed-barrier layer in block S11 may include removing all of the preliminary seed-barrier layer SM1' (e.g., see FIG. 22), other than a partial portion covered with the redistribution metal pattern RM1. In an embodiment, the partial etching of the seed-barrier layer in block S11 may be performed by a wet etching process.

Figure 24:
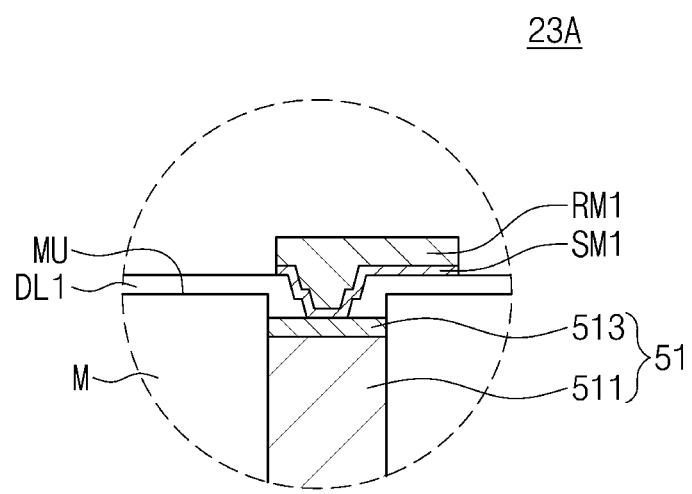
FIG. 24 is an enlarged cross-sectional view illustrating a portion 23A of the semiconductor package of FIG. 23.

Referring to the embodiment of FIG. 24, a portion of the seed-barrier layer SM1 below the redistribution metal pattern RM1 may not be etched by the partial etching of the seed-barrier layer and may remain disposed on a partial portion of the top surface 51u of the second metal portion 513 and a partial portion of the interfacial layer DL1 adjacent thereto.

Figure 25:
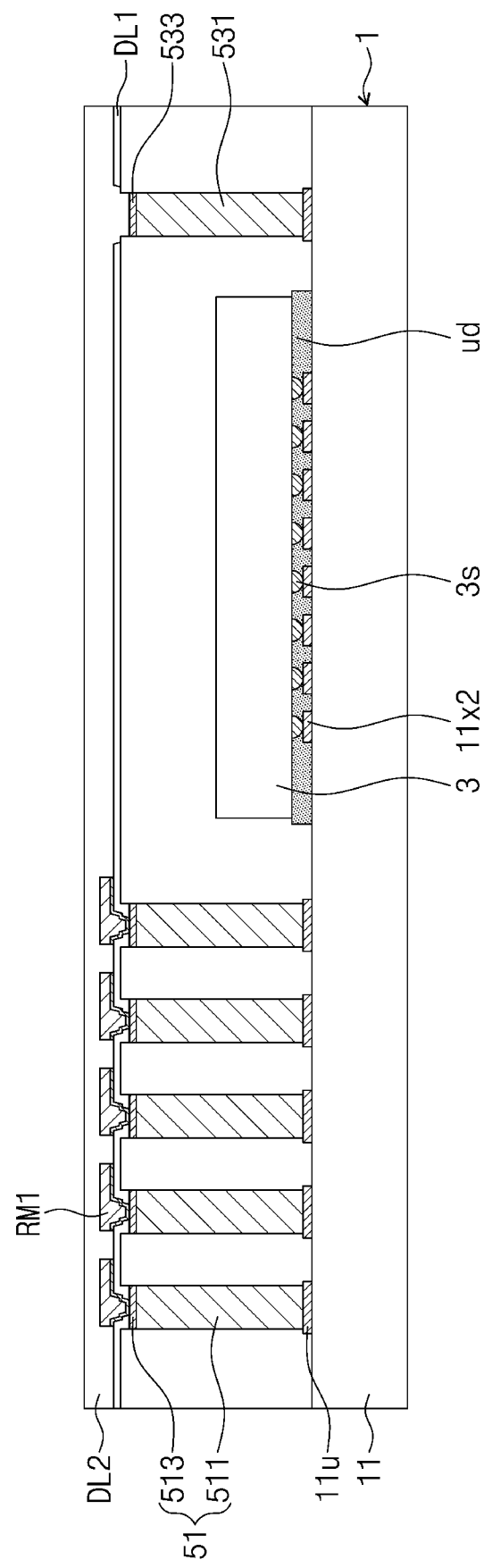

Referring to the embodiments of FIGS. 25 and 5, the forming of the first insulating layer in block S12 may include forming the first insulating layer DL2 to cover the redistribution metal pattern RM1 and the interfacial layer DL1. For example, as shown in the embodiment of FIG. 25, the first insulating layer DL2 may cover lateral sides and a top surface of the redistribution metal pattern RM1 and a top surface of partial portions of the interfacial layer DL1. In an embodiment, the forming of the first insulating layer in block S12 may be performed by a coating process (e.g., a spin coating process or a slit coating process).

In an embodiment, the forming of the second redistribution metal pattern in block S13 may be performed in the same or similar manner as the forming of the redistribution metal pattern in block S9 (e.g., see FIGS. 5 and 21). In an embodiment, the forming of the second insulating layer in block S14 may be performed in the same or similar manner as the forming of the first insulating layer in block S12 (e.g., see FIGS. 5 and 25). The bonding operation with the upper package in block S15 may include bonding the upper package UP (e.g., see FIG. 1) to the tipper redistribution layer UR (e.g., see FIG. 1).

In the semiconductor package and the fabrication method thereof according to an embodiment of the present inventive concepts, an alignment opening may be formed in an interfacial layer to expose a portion of a mold layer around an alignment pillar, and then, the interfacial layer may be cured. Thereafter, a preliminary seed-barrier layer may be formed on the exposed mold layer to have a stepwise structure that can be recognized by an alignment tool (e.g., a camera). A process of patterning a sacrificial insulating layer may be accurately performed to form a redistribution metal pattern on a bottom package. For example, a photomask, which is used to pattern the sacrificial insulating layer may be accurately aligned to the bottom package by using the stepwise structure as an alignment mark. Accordingly, a redistribution layer can be accurately formed at a desired position. Thus, it may be possible to increase production yield in a process of fabricating a semiconductor package.

In the semiconductor package and the fabrication method thereof according to an embodiment of the present inventive concepts, since an etching process is performed in advance on a conductive pillar, the conductive pillar may be formed to have a top surface that is low-than a top surface of the mold layer. Thus, the redistribution metal pattern or the seed-barrier layer may be in direct contact with the top surface of the connection pillar at a level that is lower than the top surface of the mold layer. Thus, a contact surface between the redistribution metal pattern and the connection pillar may be protected by the mold layer. Accordingly, the redistribution metal pattern or seed-barrier layer may be in stable contact with the connection pillar.

Figure 26:
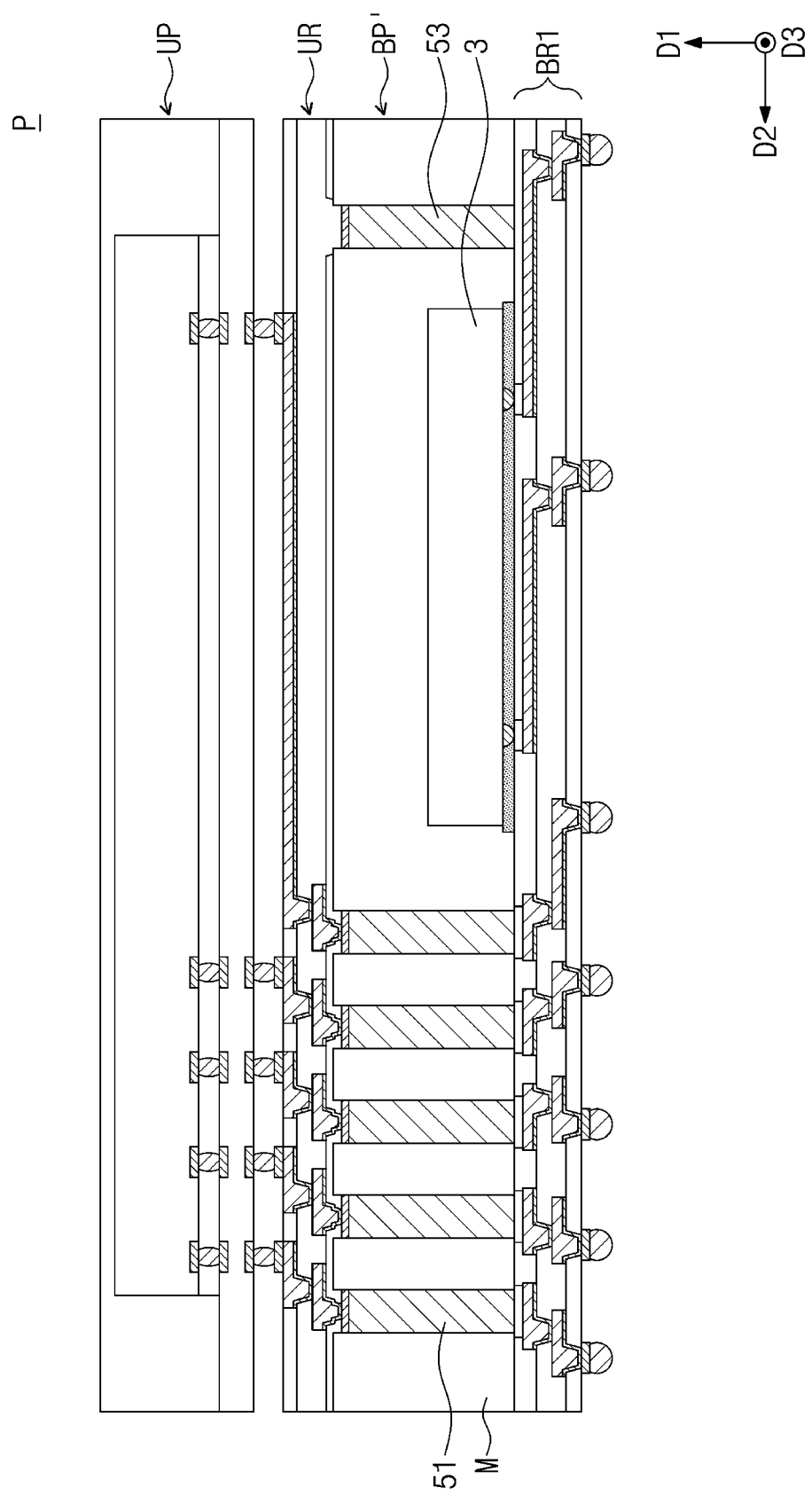
FIG. 26 is a cross-sectional view illustrating a semiconductor package according too an embodiment of the present inventive concepts.

FIG. 26 is a cross-sectional view illustrating a semiconductor package according to an embodiment of the present inventive concepts.

In the following description, the features of the semiconductor package, which are overlapped with those described with reference to the embodiments of FIGS. 1 to 25, will be omitted for convenience of explanation.

Referring to the embodiment of FIG. 26, the substrate 1 described with reference to the embodiment of FIG. 1 may is a first bottom redistribution substrate BR1. For example, the first bottom redistribution substrate BR1, not the PCB substrate, may be bonded to the bottom of the bottom package BP. In an embodiment, after the formation of the first bottom redistribution substrate BR1, the semiconductor chip 3 may be disposed on the first bottom redistribution substrate BR1. For example, as shown in the embodiment of FIG. 26, the semiconductor chip 3 may be disposed on a upper surface of the first bottom redistribution substrate BR1.

Figure 27:
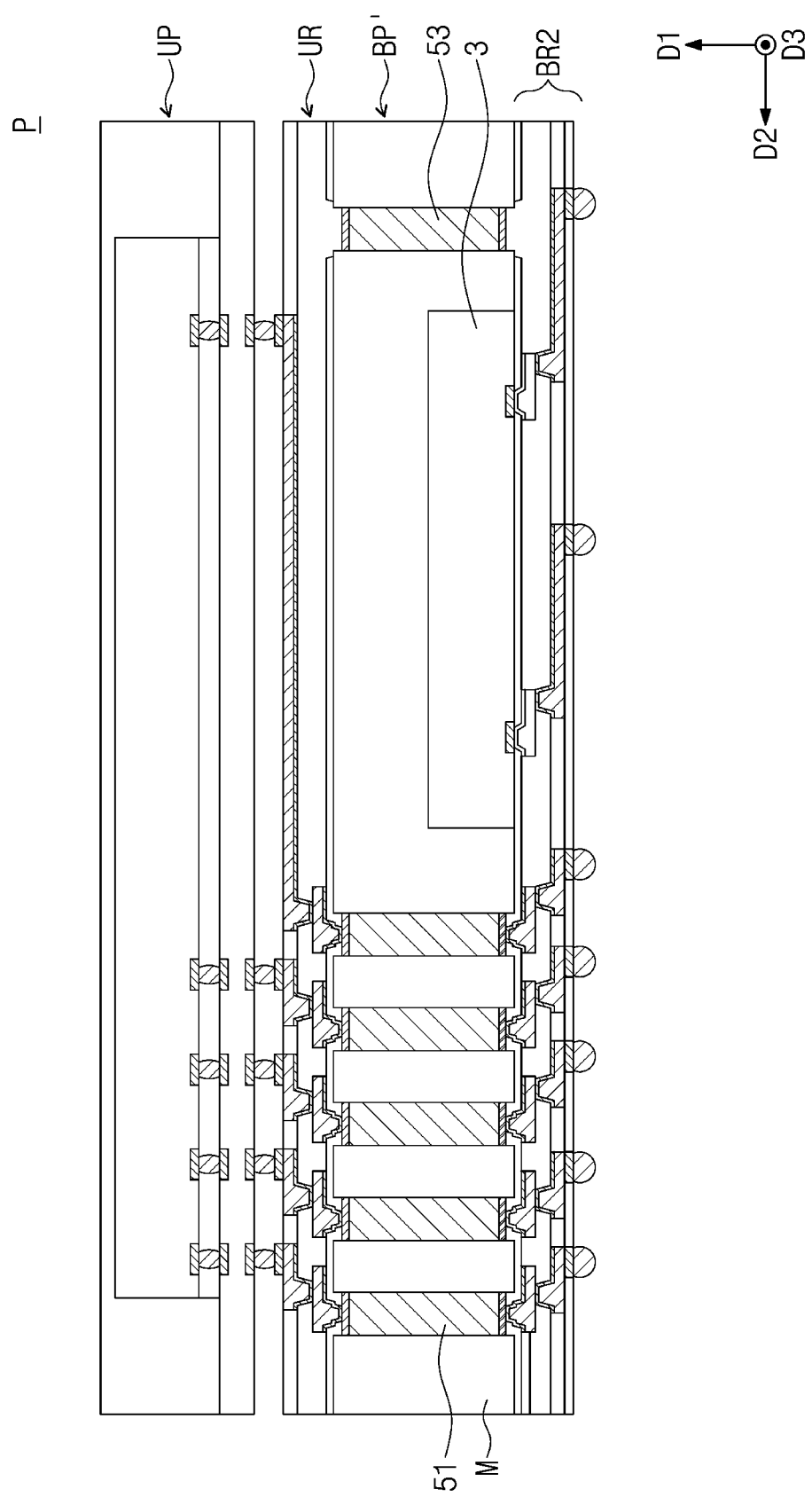
FIG. 27 is a cross-sectional view illustrating a semiconductor package according to an embodiment of the present inventive concepts.

FIG. 27 is a cross-sectional view illustrating a semiconductor package according to an embodiment of the present inventive concepts.

In the following description, the features of the semiconductor package, which are substantially similar to those described with reference to the embodiments of FIGS. 1 to 26, will be omitted.

Referring to the embodiment of FIG. 27, the first bottom redistribution substrate BR1 of FIG. 26 may be replaced with a second bottom redistribution substrate BR2. The semiconductor chip 3 may be disposed in the mold layer M, and then, the second bottom redistribution substrate BR2 may be formed on a bottom of the mold layer M. For example, the second bottom redistribution substrate BR2 may be themed directly on a bottom of the mold layer M.

According to an embodiment of the present inventive concepts, a redistribution layer of a semiconductor package may be accurately formed.

According to an embodiment of the present inventive concepts, a redistribution metal pattern can be stably connected to a conductive pillar.

According to an embodiment of the present inventive concepts, a semiconductor package can be fabricated by a relatively easy fabrication method.

According to an embodiment of the present inventive concepts, a process of fabricating a semiconductor package may have an increased production yield.

While embodiments of the present inventive concept have been particularly shown and described, it will be understood by one of ordinary skill in the art that variations in form and detail may be made therein without departing from the spirit and scope of the present inventive concepts and the present inventive concepts are not limited to the embodiments disclosed herein.

What is claimed is:

1. A semiconductor package, comprising:
a bottom package; and
an upper redistribution layer disposed on the bottom package,
wherein the bottom package comprises:
a substrate;
a semiconductor chip disposed on the substrate;
a conductive pillar that extends upwardly from the substrate, the conductive pillar is spaced apart from the semiconductor chip; and
a mold layer disposed on the substrate and enclosing the semiconductor chip and lateral side surfaces of the conductive pillar,
wherein the conductive pillar comprises:
a connection pillar configured to electrically connect the substrate to the upper redistribution layer; and an alignment pillar that is spaced apart from the connection pillar,
wherein the upper redistribution layer comprises:
a redistribution metal pattern configured to be electrically connected to the connection pillar; and
a first insulating layer in direct contact with a top surface of the redistribution metal pattern, and
wherein a top surface of the alignment pillar is in direct contact with the first insulating layer.

2. The semiconductor package of claim 1, wherein an entire portion of the top surface of the alignment pillar is in direct contact with the first insulating layer.

3. The semiconductor package of claim 1, wherein:
the upper redistribution layer further includes an interfacial layer disposed between the mold layer and the first insulating layer,
the interfacial layer includes an alignment opening exposing the top surface of the alignment pillar; and
an entire length of the alignment opening in a horizontal direction is greater than an entire length of the alignment pillar in the horizontal direction.

4. The semiconductor package of claim 1, wherein each of the connection pillars and alignment pillars comprises:
a first metal portion that extends upwardly from the substrate; and
a second metal portion disposed on the first metal portion,
wherein the first and second metal portions comprise different materials from each other.

5. The semiconductor package of claim 4, wherein a level of a top surface of the second metal portion is lower than a level of a top surface of the mold layer.

6. A semiconductor package, comprising:
a bottom package;
an upper redistribution layer disposed on the bottom package; and
an upper package disposed on the upper redistribution layer,
wherein the bottom package comprises:
a substrate;
a semiconductor chip disposed on the substrate;
a conductive pillar that extends upwardly from the substrate, the conductive pillar is spaced apart from the semiconductor chip; and
a mold layer disposed on the substrate and enclosing lateral side surfaces of the semiconductor chip and lateral side surfaces of the conductive pillar,
wherein the conductive pillar comprises:
a connection pillar configured to electrically connect the substrate to the upper redistribution layer; and
an alignment pillar that is spaced apart from the connection pillar, wherein the upper redistribution layer comprises:
an interfacial layer disposed on the mold layer;
a redistribution metal pattern configured to be electrically connected to the connection pillar; and
a first insulating layer disposed on the interfacial layer and the redistribution metal pattern; and
wherein the alignment pillar is configured to be electrically disconnected from the redistribution metal pattern.

7. The semiconductor package of claim 6, wherein an entire portion of a top surface of the alignment pillar is in direct contact with the first insulating layer.

8. The semiconductor package of claim 6, wherein:
the upper redistribution layer further includes a seed-barrier layer that is disposed below the redistribution metal pattern, the seed-barrier layer including a first portion that directly contacts all upper surface of the connection pillar;
the interfacial layer includes an alignment opening exposing atop surface of the alignment pillar;
an entire length of the alignment opening in a horizontal direction is greater than an entire length of the alignment pillar in the horizontal direction; and
a length of the first portion of the seed-barrier layer is less than an entire length of connection pillar in the horizontal direction.

9. The semiconductor package of claim 6, wherein each of the connection pillar and the alignment pillar comprises:
a first metal portion that extends upwardly from the substrate; and
a second metal portion disposed on the first metal portion,
wherein the first and second metal portions comprise different materials from each other,
wherein a level of a top surface of the second metal portion is lower than a level of a top surface of the mold layer.

10. The semiconductor package of claim 9, wherein:
the first metal portion comprises copper (Cu); and
the second metal portion comprises nickel (Ni).

11. The semiconductor package of claim 9, wherein a difference between the level of the top surface of the second metal portion and the level of the top surface of the mold layer is less than about 3 μm.

12. The semiconductor package of claim 6, wherein:
the upper redistribution layer further includes a seed-barrier layer that is disposed between the redistribution metal pattern and a top surface of the connection pillar;
the seed-barrier layer directly contacts the top surface of the connection pillar; and
the seed-barrier layer comprises a material that is different from a material of redistribution metal pattern.

13. The semiconductor package of claim 6, wherein:
the interfacial layer includes an alignment opening exposing a top surface of the alignment pillar;
an entire length of the alignment opening in a horizontal direction is greater than an entire length of the alignment pillar in the horizontal direction; and
a partial portion of atop surface of the mold layer is exposed by the alignment opening.

14. A semiconductor package, comprising:
a substrate;
a semiconductor chip disposed on the substrate;
a plurality of conductive pillars disposed on the substrate and spaced apart from the semiconductor chip;
a mold layer disposed on the substrate and enclosing the semiconductor chip and lateral side surfaces of each of the plurality of conductive pillars; and
an upper redistribution layer disposed on the mold layer,
wherein each of the plurality of conductive pillars comprises:
a first metal portion that extends upwardly from the substrate; and
a second metal portion disposed on the first metal portion,
the first metal portion and the second metal portion comprise different materials from each other, and
a level of a top surface of the second metal portion is lower than a level of a top surface of the mold layer.

15. The semiconductor package of claim 14, a thickness of the second metal portion in a vertical direction is less than a thickness of the first metal portion in the vertical direction.

16. The semiconductor package of claim 14, wherein:
the plurality of conductive pillars comprise a connection pillar configured to electrically connect the substrate to the upper redistribution layer,
wherein the upper redistribution layer comprises:
a redistribution metal pattern configured to be electrically connected to the connection pillar;
a first insulating layer in direct contact with a top surface of the redistribution metal pattern; and
a seed-barrier layer disposed between the redistribution metal pattern and the top surface of the second metal portion,
wherein the seed-barrier layer is in direct contact with the top surface of the second metal portion, and
the seed-barrier layer comprises a material that is different from a material of the redistribution metal pattern.

17. The semiconductor package of claim 16, wherein the seed-barrier layer comprises titanium (Ti).

18. The semiconductor package of claim 14, wherein a difference between the level of the top surface of the second metal portion and the level of the top surface of the mold layer is less than about 3 μm.

19. The semiconductor package of claim 14, wherein the plurality of conductive pillars further comprise:
a connection pillar configured to electrically connect the substrate to the upper redistribution layer; and
an alignment pillar spaced apart from the connection pillar,
wherein the upper redistribution layer comprises:
a redistribution metal pattern that is configured to be electrically connected to the connection pillar; and
a first insulating layer in direct contact with a top surface of the redistribution metal pattern, and
wherein a top surface of the alignment pillar is in direct contact with the first insulating layer.

20. The semiconductor package of claim 19, wherein an entire portion of the top surface of the alignment pillar is in direct contact with the first insulating layer.

\* \* \* \* \*